(12) United States Patent
Chang et al.

(10) Patent No.: US 11,563,015 B2
(45) Date of Patent: Jan. 24, 2023

(54) MEMORY DEVICES AND METHODS OF MANUFACTURING THEREOF

(71) Applicant: Taiwan Semiconductor Manufacturing Company Limited, Hsinchu (TW)

(72) Inventors: Meng-Sheng Chang, Chu-bei (TW); Chia-En Huang, Xinfeng Township (TW); Yi-Hsun Chiu, Zhubei (TW); Yih Wang, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 337 days.

(21) Appl. No.: 16/788,245

(22) Filed: Feb. 11, 2020

(65) Prior Publication Data

US 2021/0249424 A1    Aug. 12, 2021

(51) Int. Cl.
*H01L 27/112* (2006.01)
*H01L 23/525* (2006.01)
*G11C 17/18* (2006.01)
*G11C 17/16* (2006.01)

(52) U.S. Cl.
CPC ........ *H01L 27/11206* (2013.01); *G11C 17/16* (2013.01); *G11C 17/18* (2013.01); *H01L 23/5252* (2013.01)

(58) Field of Classification Search
CPC ........... H01L 23/5252; H01L 27/11206; H01L 29/42392; H01L 29/7831; G11C 17/16; G11C 17/18

USPC ........................................................ 257/379
See application file for complete search history.

(56) References Cited

U.S. PATENT DOCUMENTS

| 2014/0001441 | A1 | 1/2014 | Kim et al. |
| 2017/0133377 | A1* | 5/2017 | Glass .................. H01L 21/3065 |
| 2018/0158836 | A1 | 6/2018 | Kim et al. |
| 2019/0244933 | A1 | 8/2019 | Or-Bach et al. |
| 2021/0134721 | A1* | 5/2021 | Chiang ................. H01L 29/775 |

FOREIGN PATENT DOCUMENTS

| TW | 201721806 A | 6/2017 | |
| TW | 201806149 A | 2/2018 | |
| TW | 202006953 A | 2/2020 | |
| WO | WO-2017052591 A * | 3/2017 | ......... H01L 21/2252 |

* cited by examiner

*Primary Examiner* — Brook Kebede
(74) *Attorney, Agent, or Firm* — Foley & Lardner LLP

(57) ABSTRACT

A memory device includes a first transistor. The first transistor includes one or more first semiconductor nanostructures spaced apart from one another along a first direction. Each of the one or more first semiconductor nanostructures has a first width along a second direction perpendicular to the first direction. The memory device also includes a second transistor coupled to the first transistor in series. The second transistor includes one or more second semiconductor nanostructures spaced apart from one another along the first direction. Each of the one or more second semiconductor nanostructures has a second, different width along the second direction.

20 Claims, 35 Drawing Sheets

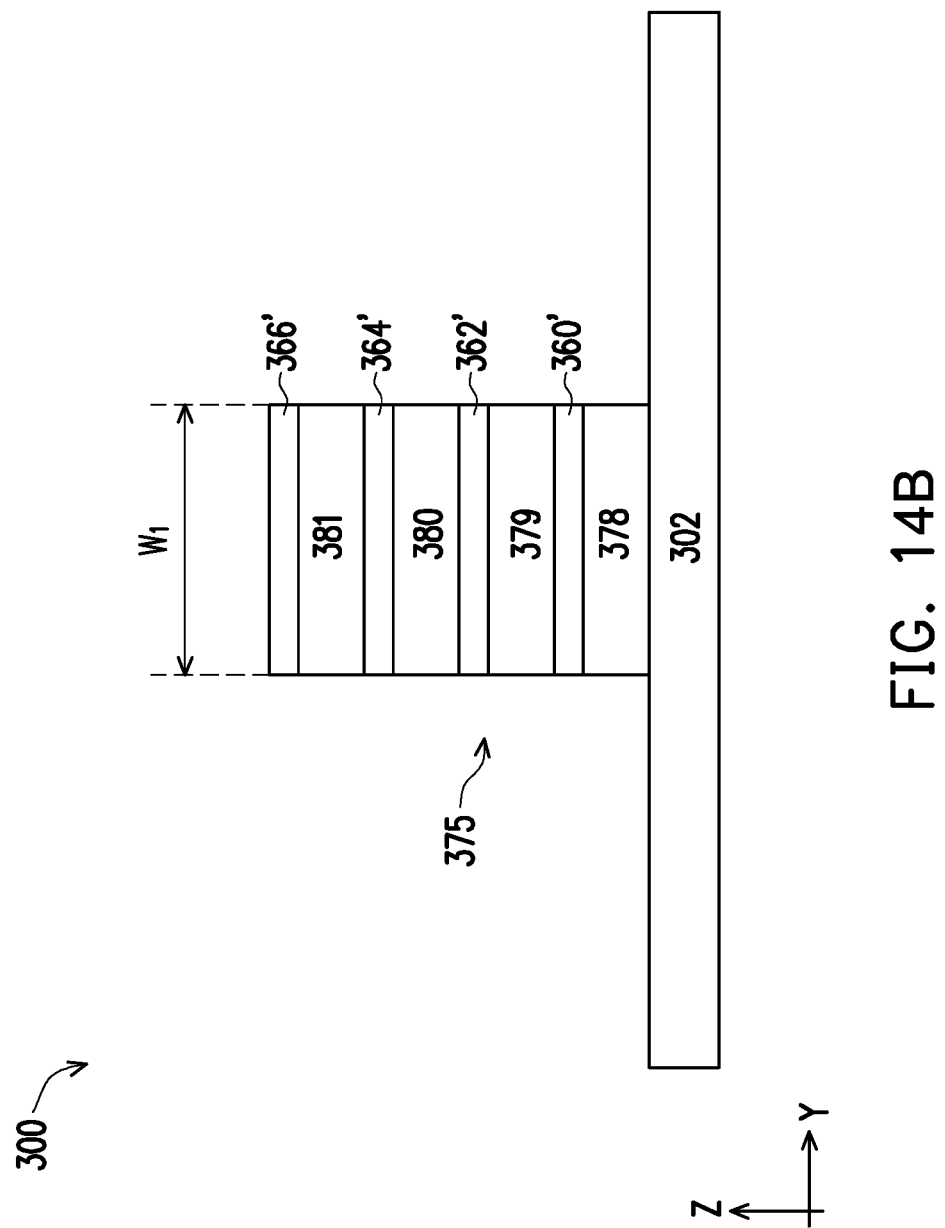

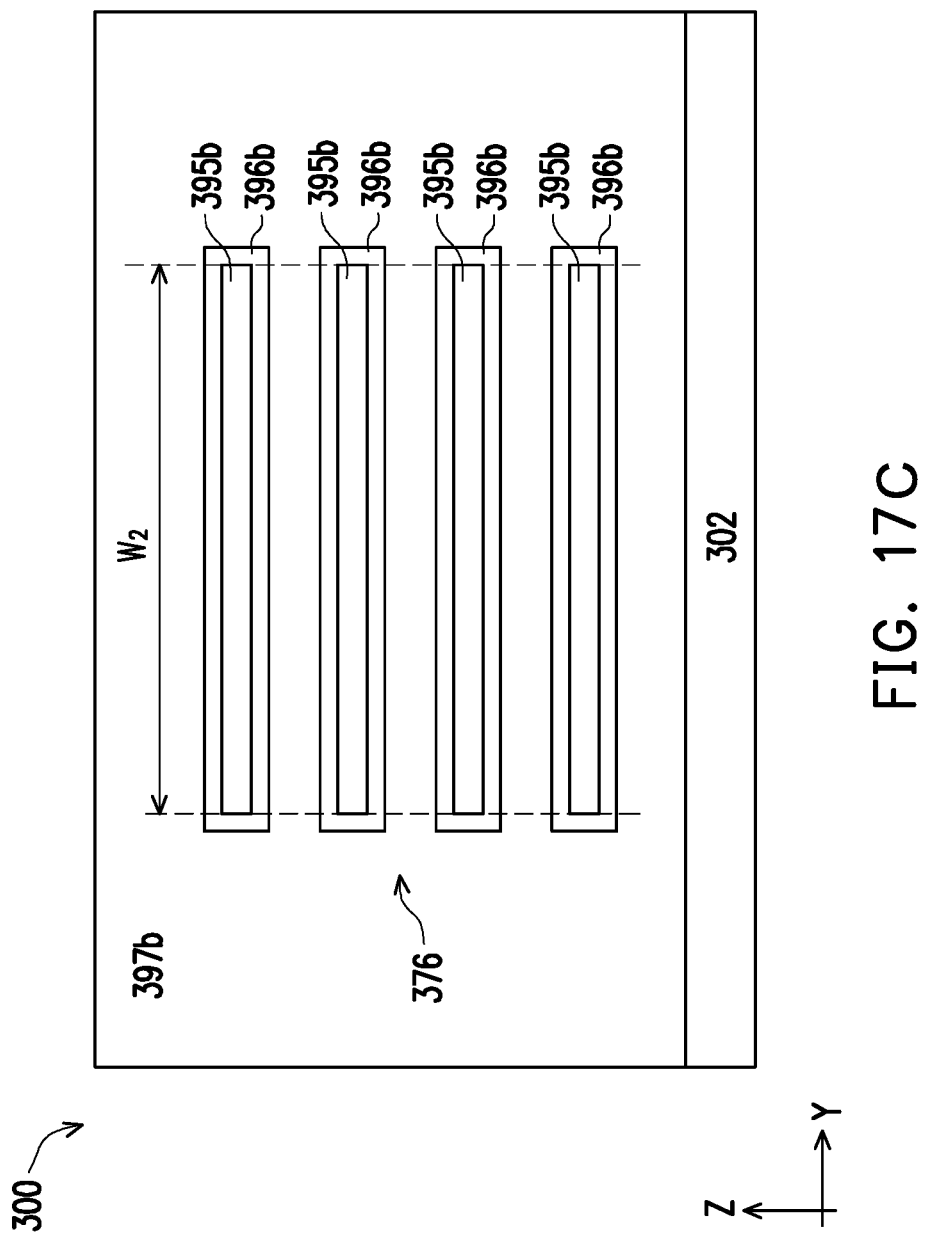

MEMORY DEVICES AND METHODS OF MANUFACTURING THEREOF

BACKGROUND

Integrated circuits (ICs) sometimes include one-time-programmable (OTP) memories to provide non-volatile memory (NVM) in which data are not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor. A gate dielectric of the programming MOS transistor may be broken down to cause the gate and the source or drain sub-feature of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantageous features of reverse-engineering proofing, since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7C, 8C, 14B, 15B, 16B, 17B illustrate cross-sectional views of the memory device of FIG. 3, cut along line B-B', at various fabrication stages, in accordance with some embodiments.

FIGS. 7D, 8D, 14C, 15C, 16C, 17C illustrate cross-sectional views of the memory device of FIG. 3, cut along line C-C', at various fabrication stages, in accordance with some embodiments.

DETAILED DESCRIPTION

Figure 1A:
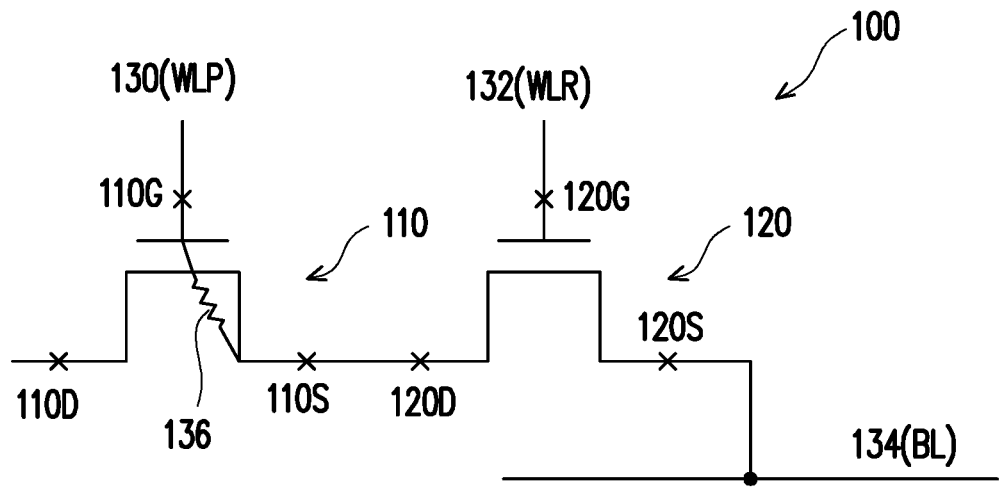
FIG. 1A illustrates an example circuit diagram of a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as fin-based transistors, can provide increased device density and increased performance over planar transistors. Some advanced non-planar transistor device architectures, such as nanostructure transistors, can further increase the performance over fin-based transistors. Example nanostructure transistors include nanostructure transistors, nanowire transistors, and the like. The nanostructure transistor includes one or more nanostructures, collectively configured as a conduction channel of the transistor, that are fully wrapped by a gate stack. When compared to the fin-based transistors where the channel is partially wrapped by a gate stack, the nanostructure transistor, in general, includes one or more gate stacks that wrap around the full perimeter of a nanostructure channel. As such, control over the nanostructure channel may be further improved, thus causing, for example, a relatively large driving current given the similar size of the fin-based transistor and nanostructure transistor.

The present disclosure provides various embodiments of a memory device including a number of memory cells, each of which is configured in a nanostructure transistor configuration. In some embodiments, the disclosed memory cell includes an anti-fuse memory cell constituted by a programming transistor and one or more reading transistors. Each of the programming transistor and reading transistor(s) includes a nanostructure transistor. Further, the programming transistor of the disclosed memory cell can have one or more nanostructure channels narrower than the one or more nanostructure channels of the reading transistor(s). As such, a programming yield of the programming transistor may be advantageously improved, partially due to an increased contact area of the gate dielectrics of the programming transistor. Also, a reading window of the reading transistor(s) can be advantageously enlarged, partially due to an increased driving current of the reading transistor(s).

FIG. 1A illustrates an example circuit diagram of a memory cell 100, in accordance with some embodiments. As shown, the memory cell (or sometimes referred to as a memory bit cell, a memory bit, or a bit) 100 includes a first transistor 110 and a second transistor 120. Each of the first and second transistors, 110 and 120, may include an n-type metal-oxide-semiconductor field-effect-transistor (MOSFET). In some other embodiments, the transistors 110 and 120 may include another type of the MOSFET, e.g., a p-type MOSFET, which shall be discussed below with respect to FIG. 1B. In some other embodiments, at least one of the transistors 110 or 120 may be replaced by another type of electronic devices, e.g., a MOS capacitor, while remaining within the scope of the present disclosure. The first transistor 110 and the second transistor 120 are electrically coupled to each other in series. For example, source of the first transistor, 110S, is connected to drain of the second transistor, 120D.

The memory cell 100 may be configured as an one-time-programmable (OTP) memory cell such as, for example, an anti-fuse cell. It is understood that the memory cell 100 may be configured as any type of the memory cell that includes two transistors electrically coupled to each other in series (e.g., a NOR-type non-volatile memory cell, a dynamic random-access memory (DRAM) cell, a two-transistor static random-access memory (SRAM) cell, etc.).

When the memory cell 100 is configured as an anti-fuse cell, the first transistor 110 can function as a programming transistor and the second transistor 120 can function as a reading transistor. As such, drain of the first transistor 110D is floating (e.g., coupled to nothing), and gate of the first transistor 110G is coupled to a programming word line (WLP) 130; and gate of the second transistor 120G is coupled to a reading word line (WLR) 132, and source of the second transistor 120S is coupled to a bit line (BL) 134.

To program the memory cell 100, the reading transistor 120 is turned on by supplying a high voltage (e.g., a positive voltage corresponding to a logic high state) to the gate 120G via the WLR 132. Prior to, concurrently with or subsequently to the reading transistor 120 being turned on, a sufficiently high voltage (e.g., a breakdown voltage ($V_{BD}$)) is applied to the WLP 130, and a low voltage (e.g., a positive voltage corresponding to a logic low state) is applied to the BL 134. The low voltage (applied on the BL 134) can be passed to the source 110S such that $V_{BD}$ will be created across the source 110S and the gate 110G to cause a breakdown of a portion of a gate dielectric (e.g., the portion between the source 110S and the gate 110G) of the programming transistor 110. After the gate dielectric of the programming transistor 110 is broken down, a behavior of the portion of the gate dielectric interconnecting the gate 110G and source 110S is equivalently resistive. For example, such a portion may function as a resistor 136. Before the programming (before the gate dielectric of the programming transistor 110 is broken down), no conduction path exists between the BL 134 and the WLP 130, when the reading transistor 120 is turned on; and after the programming, a conduction path exists between the BL 134 and the WLP 130 (e.g., via the resistor 136), when the reading transistor 120 is turned on.

To read the memory cell 100, similarly to the programming, the reading transistor 120 is turned on and the BL 134 is coupled to a voltage corresponding to the logic low state. In response, a positive voltage is applied to the gate of the programming transistor 110G. As discussed above, if the gate dielectric of the programming transistor 110 is not broken down, no conduction path exists between the BL 134 and the WLP 130. Thus, a relatively low current conducts from the WLP 130, through the transistors 110 and 120, and to the BL 134. If the gate dielectric of the programming transistor 110 is broken down, a conduction path exists between the BL 134 and the WLP 130. Thus, a relatively high current conducts from the WLP 130, through the transistor 110 (now equivalent to the resistor 136) and transistor 120, and to the BL 134. Such a low current and high current may sometimes be referred to as $I_{off}$ and $I_{on}$ of the memory cell 110, respectively. A circuit component (e.g., a sensing amplifier), coupled to the BL 134 can differentiate $I_{off}$ from $I_{on}$ (or vice versa), and thus determine whether the memory cell 100 presents a logic high ("1") or a logic low ("0"). For example, when $I_{on}$ is read, the memory cell 100 may present 1; and when $I_{off}$ is read, the memory cell 100 may present 0.

Figure 1B:
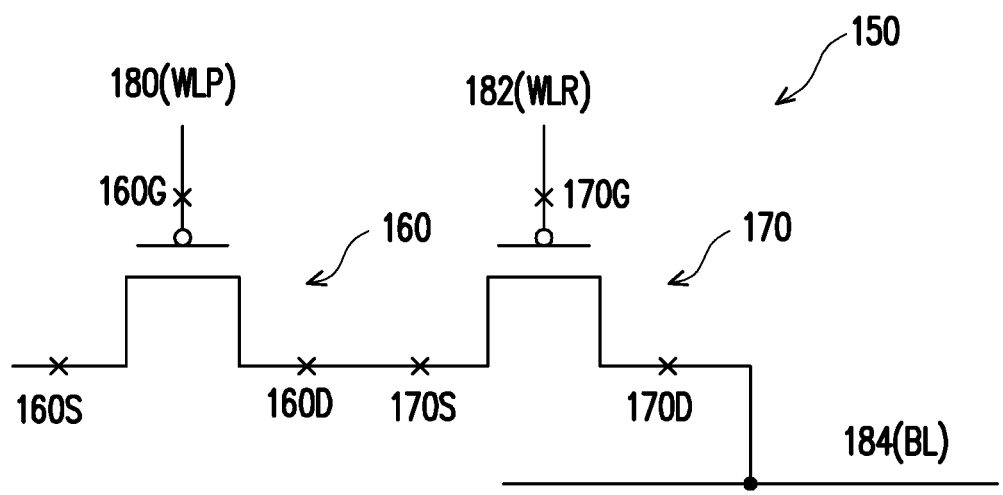
FIG. 1B illustrates another example circuit diagram of a memory cell, in accordance with some embodiments.

FIG. 1B illustrates an example circuit diagram of another memory cell 150, in accordance with some embodiments. The memory cell 150 is similar as the memory cell 100 of FIG. 1A, except that the memory cell 150 is constituted by p-type MOSFETs. As shown, the memory cell 150 includes a first transistor 160 and a second transistor 170. Each of the first and second transistors, 160 and 170, may include a p-type MOSFET. The first transistor 160 and the second transistor 170 are electrically coupled to each other in series. For example, drain of the first transistor, 160D, is connected to source of the second transistor, 170S. The memory cell 150 may function as an anti-fuse cell (as discussed above), where the first transistor 160 functions as a programming transistor of the anti-fuse cell and the second transistor 170 functions as a reading transistor of the anti-fuse cell. Similar to the memory cell 100, the gate of the programming transistor 160G is coupled to a WLP 180, the gate of the reading transistor 170G is coupled to a WLR 182, and the drain of the reading transistor 170D is coupled to a BL 184, and source of the programming transistor 160S is floating (e.g., coupled to nothing). Operations of the memory cell 150 is substantially similar to the operations of the memory cell 100 (except for the polarity of the voltages applied to the WLP 180, WLR 182, and BL 184), and thus, the discussion shall not be repeated.

Figure 1C:
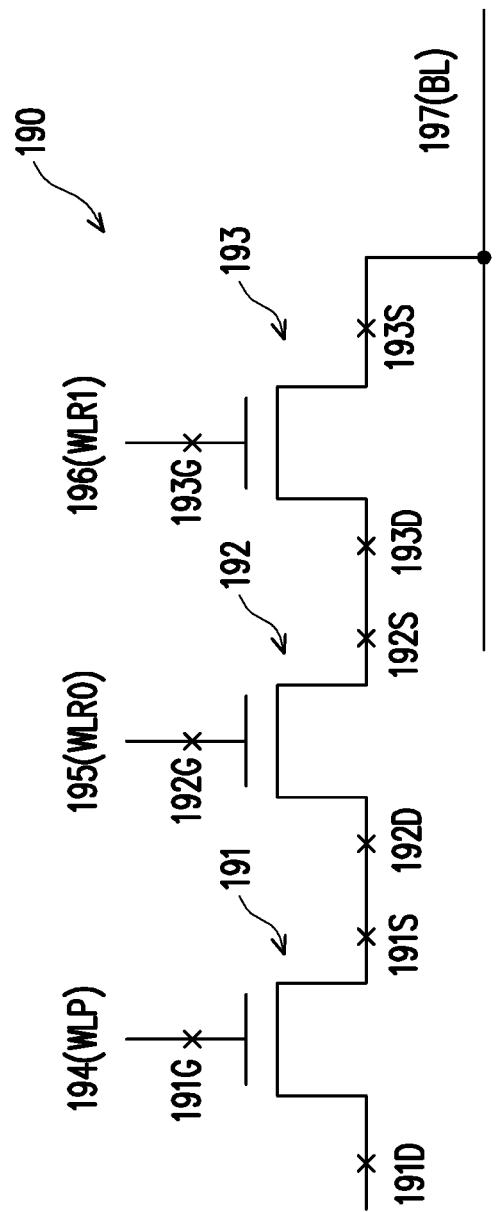
FIG. 1C illustrates yet another example circuit diagram of a memory cell, in accordance with some embodiments.

FIG. 1C illustrates an example circuit diagram of yet another memory cell 190, in accordance with some embodiments. The memory cell 190 is similar as the memory cell 100 of FIG. 1A, except that the memory cell 190 includes an additional reading transistor. As shown, the memory cell 190 includes a first transistor 191, a second transistor 192, and a third transistor 193. Each of the first, second, and third transistors, 191-193, may include an n-type MOSFET. Each of the transistors 191-193 may include a p-type MOSFET while remaining within the scope of the present disclosure. The first transistor 191, the second transistor 192, and the third transistor 193 are electrically coupled to each other in series. For example, source of the first transistor, 191S, is connected to drain of the second transistor, 192D, and source of the second transistor, 192S, is connected to drain of the third transistor, 193D. The memory cell 190 may function as an anti-fuse cell (as discussed above), where the first transistor 191 functions as a programming transistor of the anti-fuse cell and the second and third transistors, 192 and 193, collectively function as reading transistors of the anti-fuse cell. Similar to the memory cell 100, the gate of the programming transistor 191G is coupled to a WLP 194, the gates of the reading transistors, 192G and 193G, are respectively coupled to a WLR0 195 and WLR1 196, and the source of the reading transistor 193S is coupled to a BL 197, and drain of the programming transistor 191D is floating (e.g., coupled to nothing). Operations of the memory cell 190 is substantially similar to the operations of the memory cell 100, and thus, the discussion shall not be repeated.

In general, when programming an anti-fuse cell including a programming transistor and one or more reading transistors, reducing the area of a gate dielectric of the programming transistor may improve programming yield. By having a smaller area, the chance of the gate dielectric to be broken down may be increased. When reading a logic state presented by the anti-fuse cell, it is advantageous to have a higher $I_{on}$ as $I_{off}$ may be unintentionally increased due to leakage. As such, the size of a reading window, defined by a ratio of $I_{on}$ to $I_{off}$, may be reduced, which can cause the sensing amplifier to be unable to differentiate $I_{on}$ and $I_{off}$. The magnitude of $I_{on}$ may be determined by performance of the reading transistor(s). In this regard, the programming transistor of the disclosed memory cell may be configured as a first nanostructure transistor with a narrower nanostructure width, and the reading transistor(s) may be each configured as a second nanostructure transistor with a wider nanostructure width. The nanostructure width (or width), as used herein, may be referred to as the width of a nanostructure (e.g., a nanosheet, a nanowire) measured along a direction perpendicular to a direction along which respective source and drain are aligned with each other. As such, the programming transistor can have one or more narrower nanostructure channels, which advantageously reduces the area of a corresponding gate dielectric. Also, the reading transistor can have one or more wider nanostructure channels, which advantageously increases the magnitude of current conducting through the anti-fuse cell.

FIGS. 2A, 2B, 2C, 2D, 2E, 2F, and 2G provide various examples of design layouts to fabricate the programming transistor with the narrower nanostructure width and the reading transistor(s) with the wider nanostructure width of an anti-fuse cell, in accordance with some embodiments. The layouts of FIGS. 2A to 2G may be used to fabricate nanostructure transistors, in some embodiments. However, it is understood that the layouts of FIGS. 2A to 2G are not limited to fabricating nanostructure transistors. Each of the layouts of FIGS. 2A to 2G may be used to fabricate any of various other types of transistors such as, for example, fin-based transistors (typically knows as FinFETs), nanowire transistors, while remaining within the scope of the present disclosure. It is appreciated that the layouts shown in FIGS. 2A to 2G have been simplified for illustration purposes. Thus, each of the layouts may include one or more other features while remaining within the scope of the present disclosure.

Figure 2A:
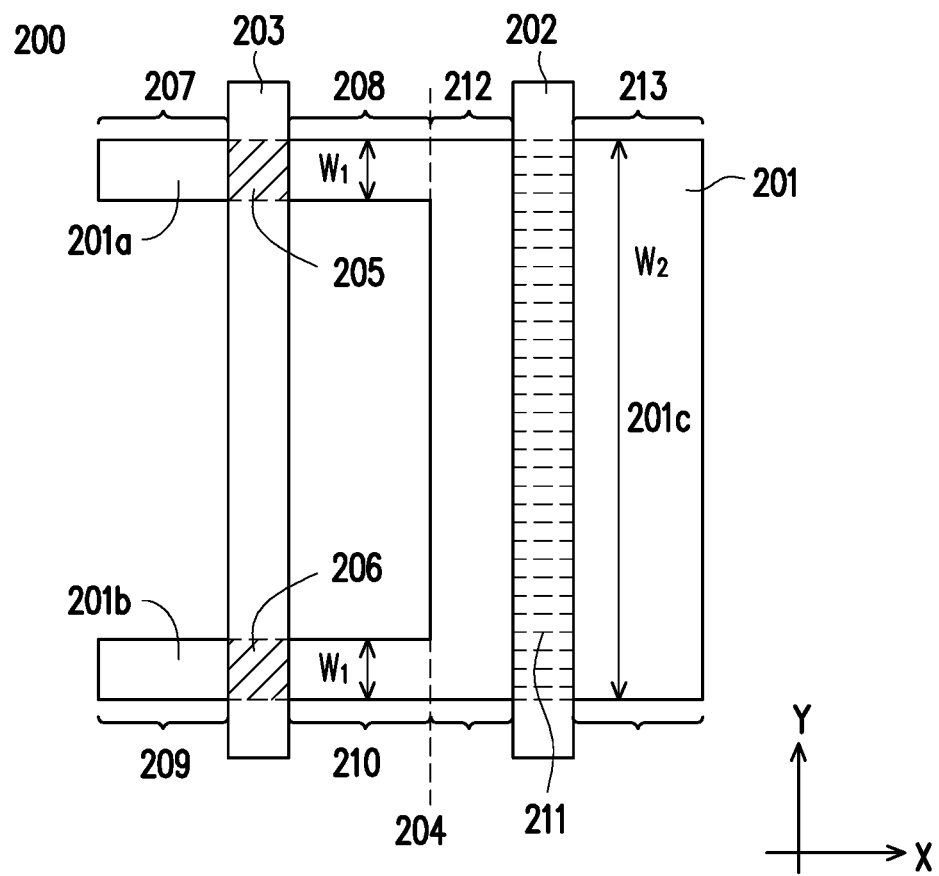
FIGS. 2A, 2B, 2C, 2D, 2E, 2F, and 2G illustrate example design layouts of a memory cell, in accordance with some embodiments.

Referring to FIG. 2A, layout 200 is depicted, in accordance with some embodiments. The layout 200 includes a first feature 201, a second feature 202, and a third feature 203. Each of the features 200-203 may correspond to one or more patterning process (e.g., a photolithography process) to make a physical device feature. For example, the first feature 201 may be used to define or otherwise make an active region on a substrate. Such an active region may be a stack of alternating layers of one or more nanostructure transistors, a fin-shaped region of one or more FinFETs, or an oxide-definition (OD) region of one or more planar transistors. The active region may serve as a source or drain of the respective transistor. Accordingly, the first feature 201 may be herein referred to as "active feature 201." In some embodiments, the first feature 201 may include a number of sub-features, each of which extends along a first direction (e.g., the X direction). Such sub-features shall be discussed below. The second feature 202 and third feature 203, which may extend along a second direction (e.g., the Y direction) with respect to the first feature 201, may be used to define or otherwise make gates of the respective transistors. Accordingly, the second feature 202 and third feature 203 may be herein referred to as "gate feature 202" and "gate feature 203," respectively. In fabrication using the layout 200, the active feature 201 may correspond to a first patterning process, and the gate features 202-203, extending over the active feature 201, may correspond to a second patterning process following the first patterning process.

As shown, the active feature 201 includes sub-features 201a, 201b, and 201c. The sub-features 201a and 201b, extending along the X direction, are in parallel with each other. The sub-features 201a and 201b may have a width $W_1$ along the Y direction. The sub-feature 201c, extending along the X direction, may have a width $W_2$ along the Y direction. A ratio of the width $W_1$ to $W_2$ may be any value between 0 to 1 that satisfies a predefined condition (e.g., a design constraint or requirement), in accordance with some embodiments. The sub-feature 201c extends from the sub-features 201a and 201b, thereby defining a symbolic boundary (as indicated by dotted line 204 in FIG. 2A) between the narrower sub-features 201a-b and the wider feature 201c.

In some embodiments, the gate feature 203 is configured to overlay respective central portions, 205 and 206, of the sub-features 201a and 201b (used to make active regions with the width $W_1$), so as to define side portions 207, 208, 209, and 210. For example, the side portions of the sub-feature 201a, 207 and 208, are respectively placed on both sides of the central portion 205 that is overlaid by the third feature 203; the side portions of the sub-feature 201b, 209 and 210, are respectively placed on both sides of the central portion 206 that is overlaid by the third feature 203. The gate feature 202 is configured to overlay a central portion, 211, of the sub-feature 201c (used to make active regions with the width $W_2$), so as to define side portions 212 and 213. For example, the side portions of the sub-feature 201c, 212 and 213, are respectively placed on both sides of the central portion 211 that is overlaid by the second feature 202. The boundary 204 is located between the gate feature 202 and gate feature 203 to divide the sub-feature(s) with the narrower width $W_1$ and the sub-feature(s) with the wider width $W_2$. Accordingly, at least some features of a first transistor may be defined by the central portions 205-206 and the side portions 207-210 of the narrower sub-features 201a-b, and at least some features of a second transistor, coupled to the first transistor in series, may be defined by the central portion 211 and the side portions 212-213 of the wider sub-feature 201c.

In an example where the layout 200 is used to make an anti-fuse memory cell (e.g., 100 in FIG. 1A), the portions of the gate feature 203 overlaying the central portions 205-206 may be collectively used to define the gate 110G; the side portion 207 of the sub-feature 201a and side portion 209 of the sub-feature 201b may be collectively used to form the drain 110D; the side portion 208 of the sub-feature 201a and the side portion 210 of the sub-feature 201b may be collectively used to form the source 110S; the central portion 205 of the sub-feature 201a and central portion 206 of the sub-feature 201b may be collectively used to form a conduction channel of the programming transistor 110; the portion of the gate feature 202 overlaying the central portion 211 may be used to define the gate 120G; the side portion 212 of the sub-feature 201c may be used to form the drain 120D; the side portion 213 of the sub-feature 201c may be used to form the source 120S; and the central portion 211 of the sub-feature 201c may be used to form a conduction channel of the reading transistor 120.

In some embodiments, the number of narrower sub-features overlaid by a gate feature may be referred to as a first number ("N"), and the number of wider sub-features overlaid by a gate feature may be referred to as a second number ("M"). The number N may correspond to a fin or stack number of a first transistor, and the number M may correspond to a fin or stack number of a second transistor, which is coupled to the first transistor in series. In some embodiments, N is greater than or equal to M. Continuing with the same example, the programming transistor 110 may be characterized with a fin number of 2 as the number of narrower sub-feature overlaid by the gate feature 203, 201a and 201b, is 2, and the reading transistor 120 may be characterized by a fin number of 1 as the number of wider sub-features overlaid by the gate feature 202, 201c, is 1.

The respective layouts shown in FIGS. 2A to 2G follow the similar principle to define the programming transistor and the reading transistor(s) of an anti-fuse cell. Thus, each of the layouts of FIGS. 2B to 2G shall be briefly described as follows.

Figure 2B:
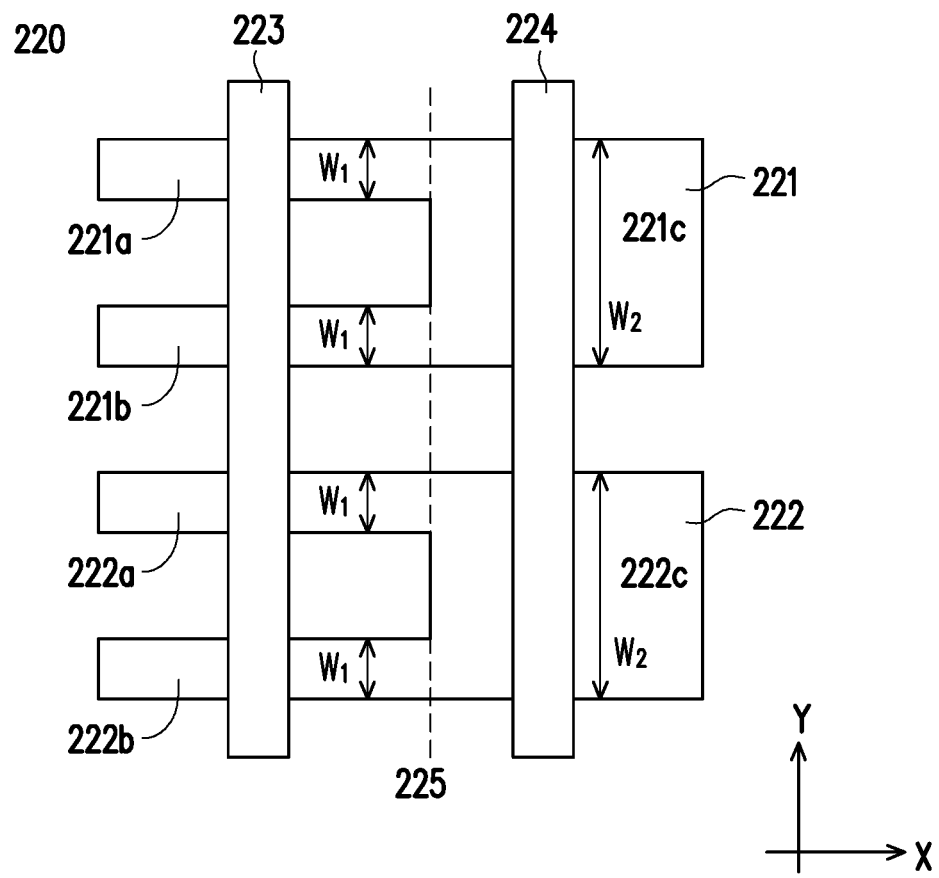

Referring to FIG. 2B, a layout 220 is shown, in accordance with some embodiments. The layout 220 includes active features 221 and 222, and gate features 223 and 224. The active feature 221 includes sub-features 221a and 221b with the width $W_1$, and a sub-feature 221c with the width $W_2$. The active feature 222 includes sub-features 222a and 222b with the width $W_1$, and a sub-feature 222c with the width $W_2$. Boundary 225, located between the gate features 223 and 224, is configured to differentiate the narrower sub-features (having the width $W_1$) and the wider sub-features (having the width $W_2$). In some embodiments, some features of the programming transistor of an anti-fuse cell can be defined by the gate feature 223 and the sub-features having the width $W_1$ (e.g., 221a-b, 222a-b), and some features of the coupled reading transistor can be defined by the gate feature 224 and the sub-features having the width $W_2$ (e.g., 221c, 222c). Based on the principle defined above, the programming transistor may have a fin number of 4, and the reading transistor may have a fin number of 2.

Figure 2C:
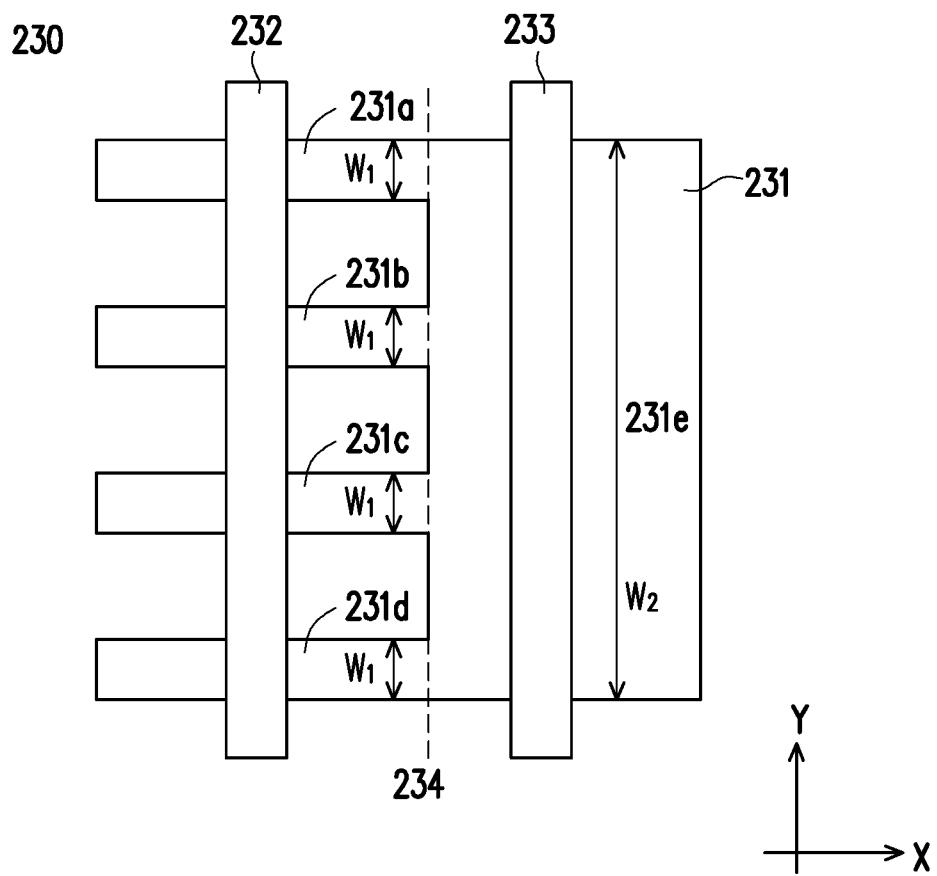

Referring to FIG. 2C, a layout 230 is shown, in accordance with some embodiments. The layout 230 includes active feature 231, and gate features 232 and 233. The active feature 231 includes sub-features 231a, 231b, 231c, and 231d with the width $W_1$, and a sub-feature 231e with the width $W_2$. Boundary 234, located between the gate features 232 and 233, is configured to differentiate the narrower sub-features (having the width $W_1$) and the wider sub-feature (having the width $W_2$). In some embodiments, some features of the programming transistor of an anti-fuse cell can be defined by the gate feature 232 and the sub-features having the width $W_1$ (e.g., 231a-d), and some features of the coupled reading transistor can be defined by the gate feature 233 and the sub-feature having the width $W_2$ (e.g., 231e). Based on the principle defined above, the programming transistor may have a fin number of 4, and the reading transistor may have a fin number of 1.

Figure 2D:
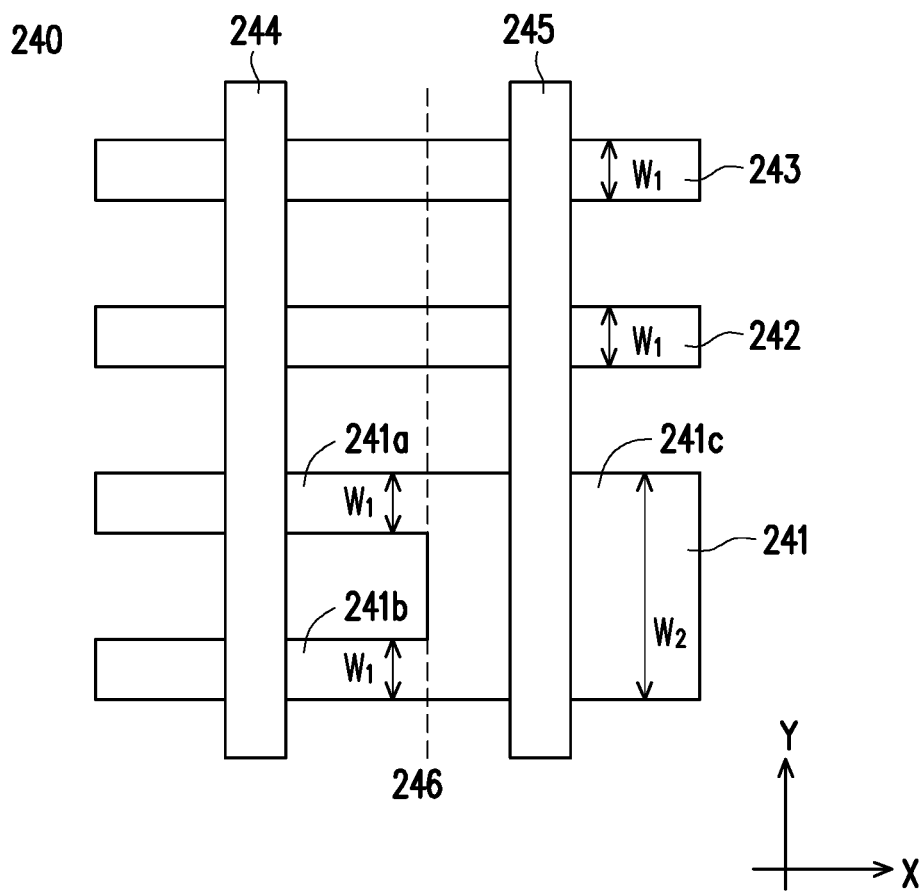

Referring to FIG. 2D, a layout 240 is shown, in accordance with some embodiments. The layout 240 includes active features 241, 242, and 243, and gate features 244 and 245. The active feature 241 includes sub-features 241a and 241b with the width $W_1$, and a sub-feature 241c with the width $W_2$. Boundary 246, located between the gate features 244 and 245, is configured to differentiate the narrower sub-features (having the width $W_1$) and the wider sub-feature (having the width $W_2$). The active features 242 and 243, having the width $W_1$, extend across regions of the narrower sub-features (e.g., 241a-b) and the wider sub-feature (e.g., 241c) of the active feature 241 along the X direction. As such, the boundary 246 may divide each of active features 242-243 to a first sub-feature in parallel with the narrower sub-features (e.g., 241a-b), and a second first sub-feature in parallel with the wider sub-feature (e.g., 241c). In some embodiments, some features of the programming transistor of an anti-fuse cell can be defined by the gate feature 244, the sub-features having the width $W_1$ (e.g., 241a-b), and the respective first sub-features of the active features 242-243 having the width $W_1$, and some features of the coupled reading transistor can be defined by the gate feature 245, the sub-feature having the width $W_2$ (e.g., 241c), and the respective second sub-features of the active features 242-243 having the width $W_1$.

Figure 2E:
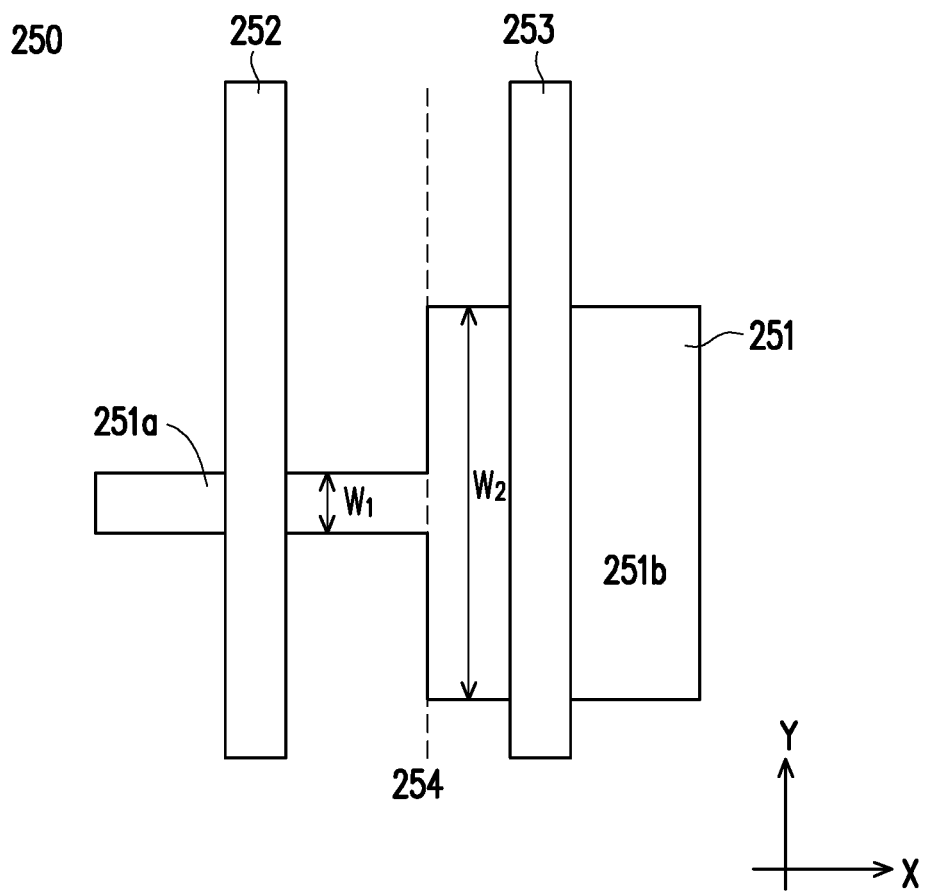

Referring to FIG. 2E, a layout 250 is shown, in accordance with some embodiments. The layout 250 includes active feature 251, and gate features 252 and 253. The active feature 251 includes a sub-feature 251a with the width $W_1$, and a sub-feature 251b with the width $W_2$. A location of the sub-feature 251a disposed with respect to the sub-feature 251b may be shifted along the Y direction, while remaining within the scope of the present disclosure. Boundary 254, located between the gate features 252 and 253, is configured to differentiate the narrower sub-feature (having the width $W_1$) and the wider sub-feature (having the width $W_2$). In some embodiments, some features of the programming transistor of an anti-fuse cell can be defined by the gate feature 252 and the sub-feature having the width $W_1$ (e.g., 251a), and some features of the coupled reading transistor can be defined by the gate feature 253 and the sub-feature having the width $W_2$ (e.g., 251b). Based on the principle defined above, the programming transistor may have a fin number of 1, and the reading transistor may have a fin number of 1.

Figure 2F:
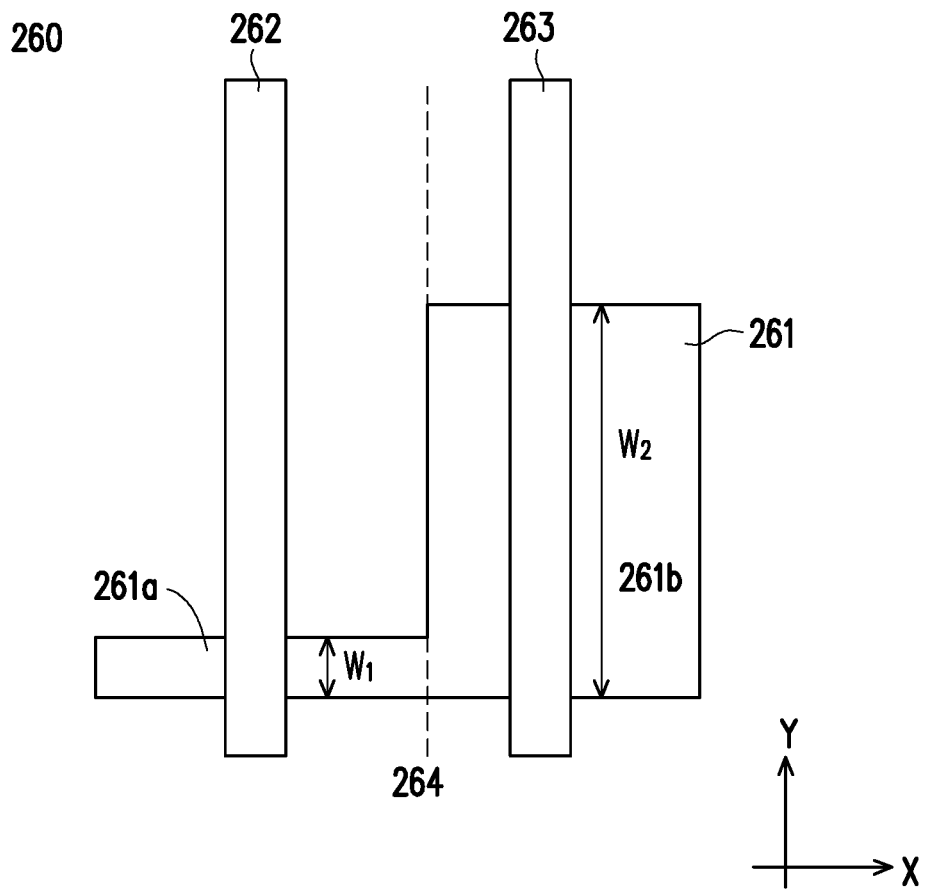

Referring to FIG. 2F, a layout 260 is shown, in accordance with some embodiments. The layout 260 is similar as the layout 250 shown in FIG. 2E except for the relative configuration between a narrower sub-feature and a wider narrower sub-feature along the Y direction. For example, the layout 260 includes active feature 261, and gate features 262 and 263. The active feature 261 includes a sub-feature 261a with the width $W_1$, and a sub-feature 261b with the width $W_2$. A location of the sub-feature 261a disposed with respect to the sub-feature 261b may be shifted along the Y direction, while remaining within the scope of the present disclosure. Boundary 264, located between the gate features 262 and 263, is configured to differentiate the narrower sub-feature (having the width $W_1$) and the wider sub-feature (having the width $W_2$). In some embodiments, some features of the programming transistor of an anti-fuse cell can be defined by the gate feature 262 and the sub-feature having the width $W_1$ (e.g., 261a), and some features of the coupled reading transistor can be defined by the gate feature 263 and the sub-feature having the width $W_2$ (e.g., 261b). Based on the principle defined above, the programming transistor may have a fin number of 1, and the reading transistor may have a fin number of 1.

Figure 2G:
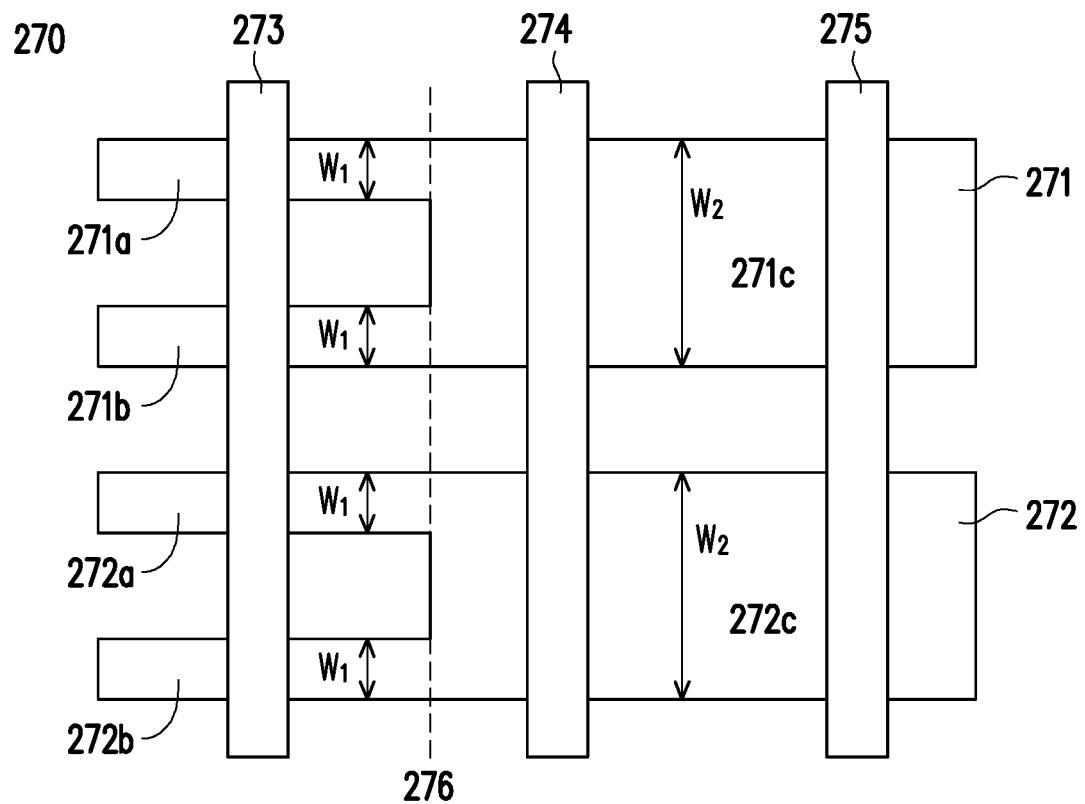

Referring to FIG. 2G, a layout 270 is shown, in accordance with some embodiments. The layout 220 includes active features 271, and 272, and gate features 273, 274, and 275. The active feature 271 includes sub-features 271a and 271b with the width $W_1$, and a sub-feature 271c with the width $W_2$. The active feature 272 includes sub-features 272a and 272b with the width $W_1$, and a sub-feature 272c with the width $W_2$. Boundary 276, located between the gate features 273 and 274, is configured to differentiate the narrower sub-features (having the width $W_1$) and the wider sub-features (having the width $W_2$). In some embodiments, some features of the programming transistor of an anti-fuse cell can be defined by the gate feature 273 and the sub-features having the width $W_1$ (e.g., 271a-b, 272a-b), and some features of the coupled reading transistors can be defined by the gate features 274-275 and the sub-features having the width $W_2$ (e.g., 271c, 272c). Based on the principle defined above, the programming transistor may have a fin number of 4, and the reading transistors may each have a fin number of 2. Although in the illustrated embodiment of FIG. 2G, the sub-features 271c and 272c to define the reading transistors share the same width $W_2$, it is understood that the sub-features for the reading transistors may be merged as one sub-feature to have the width $W_2$ (e.g., similar as FIGS. 2E and 2F) or a mix of sub-features with different widths (e.g., similar as FIG. 2D) while remaining within the scope of the present disclosure.

Figure 3:
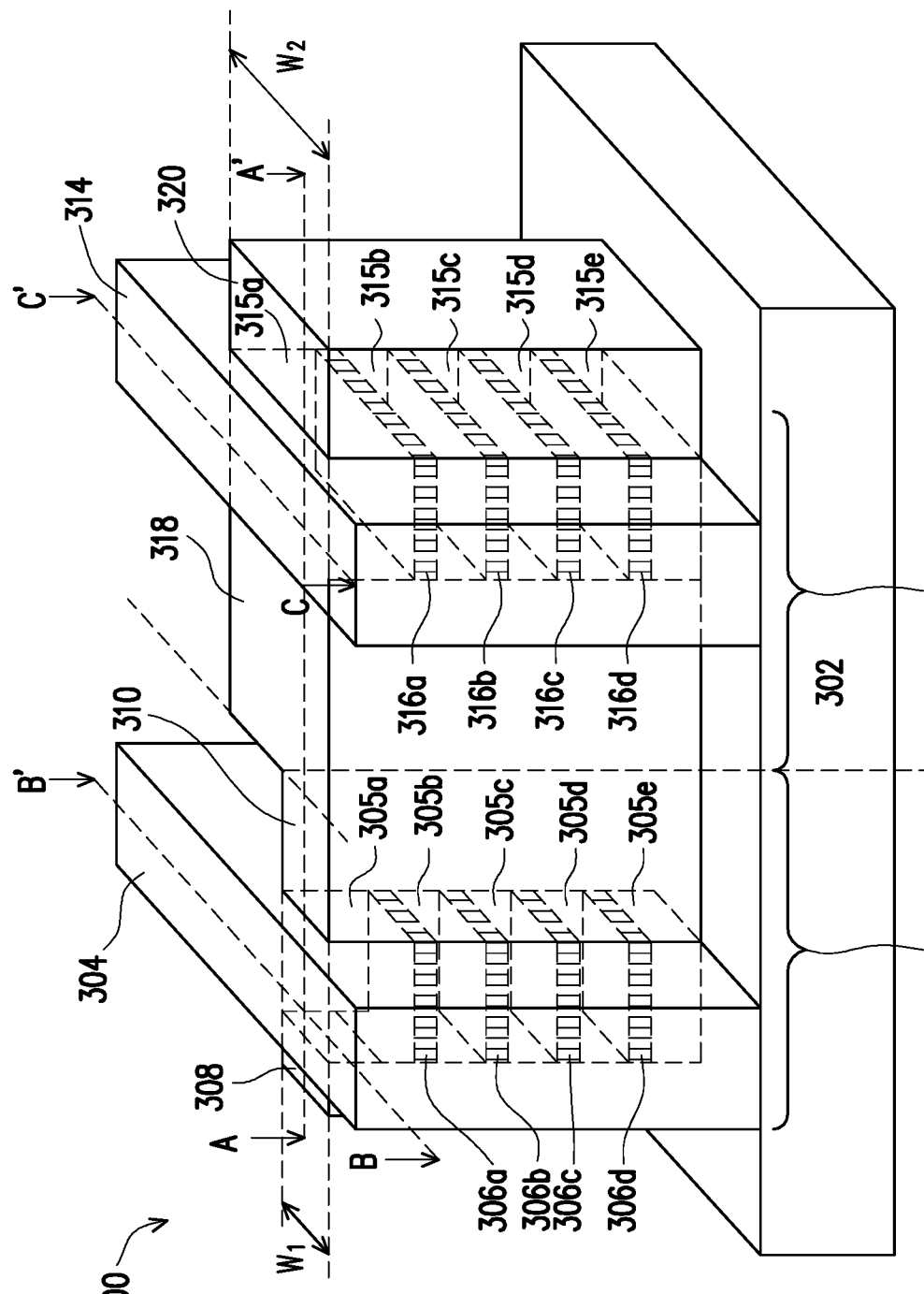
FIG. 3 illustrates a perspective view of a memory device, in accordance with some embodiments.

Referring to FIG. 3, a perspective view of a memory device 300 in a nanostructure transistor configuration is shown. In accordance with some embodiments, the memory device 300 may be a portion of an anti-fuse memory cell that includes a programming transistor and a reading transistor. The perspective view of FIG. 3 is an overview of the memory device 300 and thus, some of the features of the memory device 300 are not identified in FIG. 3. More detailed features of the memory device 300 shall be shown and discussed below with respect to the FIGS. 5 to 17C.

The memory device 300 may be formed on (or include) a substrate 302. Over the substrate 302, the memory device 300 includes a first gate structure 304 and a second gate structure 314. Each of the first and second gate structures, 304 and 314, is formed as a fin-shaped structure to wrap around the respective channel of a transistor. In some embodiments, the conduction channel may be collectively constituted by one or more semiconductor nanostructures. The gate structure 304 may wrap around nanostructures (or nanostructure channels) 306a, 306b, 306c, and 306d that are spaced from on another (or placed on top of one another) along the Z direction; and the gate structure 314 may wrap around nanostructures (or nanostructure channels) 316a, 316b, 316c, and 316d that are spaced from on another (or placed on top of one another) along the Z direction. On the respective sides of the first gate structure 304, a drain 308 and a source 310 are formed. The drain 308 and source 310 may be characterized with a width approximately equal to $W_1$. On the respective sides of the second gate structure 314, a drain 318 and a source 320 are formed. The drain 318 and source 320 may be characterized with a width approximately equal to $W_2$.

As a non-limiting example, the memory device 300 may be formed based on the layout 260 shown in FIG. 2F. As such, when viewed from the top, the gate structures 304 and 314 may be formed from the gate features 262 and 263, respectively; the drain 308, the nanostructures 306a-d wrapped by the gate structure 304, and the source 310 may be formed from the sub-feature 261a of the active feature 261; and the drain 318, the nanostructures 316a-d wrapped by the gate structure 314, and the source 320 may be formed from the sub-feature 261b of the active feature 261. In some embodiments, a first transistor 350a (e.g., the above-mentioned programming transistor) may be formed by the gate structure 304, the corresponding wrapped channel, the drain 308, and the source 310; and a second transistor 350b (e.g., the above-mentioned reading transistor) may be formed by the gate structure 314, the corresponding wrapped channel, the drain 318, and the source 320.

Specifically, each of the first and second gate structures, 304 and 314, includes multiple gate stacks. Each of the gate stacks may include one or more gate dielectrics and one or more gate metals. Two of the gate stacks are configured to collectively wrap around a corresponding one of the one or more nanostructures. For instance, the first gate structure 304 includes gate stacks 305a, 305b, 305c, 305d, and 305e. The gate stacks 305a-e may have a substantially similar width (along the Y direction) as the gate structure 304, and the nanostructures 306a-d are characterized with a width (along the Y direction), about $W_1$, which is less than the width of the gate stacks 305a-e. Additionally, each of the gate stacks 305a-e may include portions that extend along the Z direction to adjoin, connect to, or otherwise merge with an adjacent gate stack. For example, in addition to laterally extending along (e.g., on top of) the nanostructures 306a, the gate stack 305a includes a portion that extends downwardly to be merged with a portion of the adjacent gate stack 305b that extends upwardly.

As such, two adjacent ones of the gate stacks 305a-e can wrap the full perimeter of a corresponding one of the nanostructures 306a-d. The gate stacks 305a and 305b can collectively wrap around at least four sides of the nanostructure 306a, with two sides of the nanostructure 306a respectively coupled to the drain 308 and source 310; the gate stacks 305b and 305c can collectively wrap around at least four sides of the nanostructure 306b, with two sides of the nanostructure 306b respectively coupled to the drain 308 and source 310; gate stacks 305c and 305d can collectively wrap around at least four sides of the nanostructure 306c, with two sides of the nanostructure 306c respectively coupled to the drain 308 and source 310; and gate stacks 305d and 305e can collectively wrap around at least four sides of the nanostructure 306d, with two sides of the nanostructure 306d respectively coupled to the drain 308 and source 310.

Similarly, the second gate structure 314 includes gate stacks 315a, 315b, 315c, 315d, and 315e. The gate stacks 315a-e may have a substantially similar width (along the Y direction) as the gate 314, and the nanostructures 316a-d is characterized with a width (along the Y direction), about $W_2$, which is less than the width of the gate stacks 315a-e. Additionally, each of the gate stacks 315a-e may include portions that extend along the Z direction to adjoin, connect to, or otherwise merge with an adjacent gate stack. As such, two adjacent ones of the gate stacks 315a-e can wrap the full perimeter of a corresponding one of the nanostructures 316a-d. The gate stacks 315a and 315b can collectively wrap around at least four sides of the nanostructure 316a, with two sides of the nanostructure 316a respectively coupled to the drain 318 and source 320; the gate stacks 315b and 315c can collectively wrap around at least four sides of the nanostructure 316b, with two sides of the nanostructure 316b respectively coupled to the drain 318 and source 320; gate stacks 315c and 315d can collectively wrap around at least four sides of the nanostructure 316c, with two sides of the nanostructure 316c respectively coupled to the drain 318 and source 320; and gate stacks 315d and 315e can collectively wrap around at least four sides of the nanostructure 316d, with two sides of the nanostructure 316d respectively coupled to the drain 318 and source 320.

Figure 4:
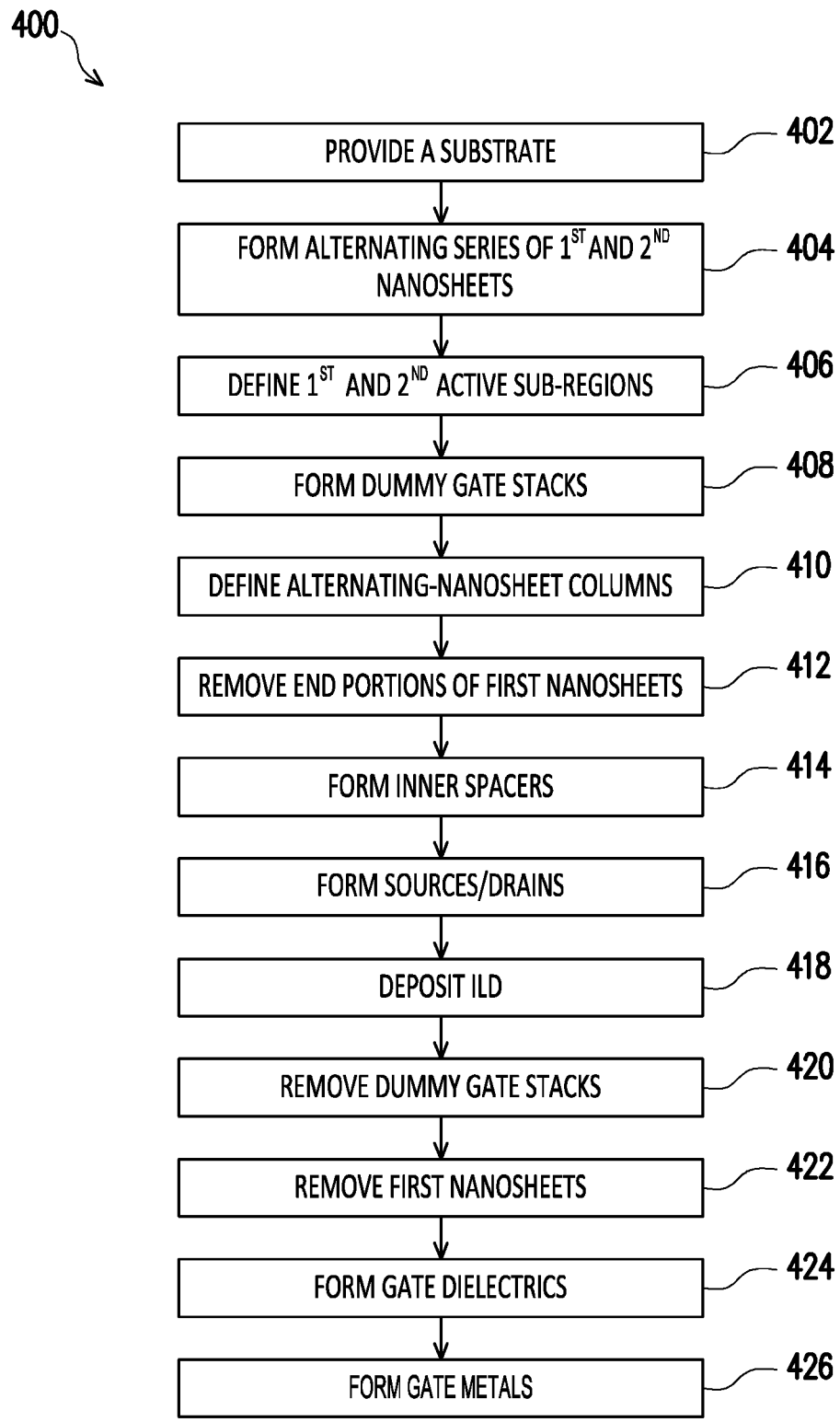
FIG. 4 illustrates a flow chart of a method of fabricate the memory device of FIG. 3, in accordance with some embodiments.

FIG. 4 illustrates a flowchart of a method 400 to form a memory device, according to one or more embodiments of the present disclosure. The method 400 may be used to form an anti-fuse memory cell, including a programming transistor and a reading transistor, coupled in series. For example, at least some of the operations described in the method 400 may be used to form the memory device 300. It is noted that the method 400 is merely an example and is not intended to limit the present disclosure. Accordingly, it is understood that additional operations may be provided before, during, and after the method 400 of FIG. 4, and that some other operations may only be briefly described herein.

The operations of the method 400 may be associated with cross-sectional views of the memory device 300, cut along line A-A', at respective fabrication stages as shown in FIGS. 5, 6, 7A, 8A, 9A, 10, 11, 12A, 13, 14A, 14B, 14C, 15A, 15B, 15C, 16A, 16B, 16C, 17A, 17B, 17C, and 18. For illustration purpose, top views of the memory device 300 corresponding to FIGS. 7A, 8A, 9A, and 12A are further shown in FIGS. 7B, 8B, 9B, and 12B, respectively; cross-sectional views of the memory device 300, cut along line B-B', corresponding to FIGS. 7A, 8A, 14A, 15A, 16A, and 17A are further shown in FIGS. 7C, 8C, 14B, 15B, 16B, 17B, respectively; and cross-sectional views of the memory device 300, cut along line B-B', corresponding to FIGS. 7A, 8A, 14A, 15A, 16A, and 17A are further shown in FIGS. 7D, 8D, 14C, 15C, 16C, 17C, respectively. In some embodiments, the memory device 300 may be included in or otherwise coupled to a microprocessor, another memory device, and/or other integrated circuit (IC). Also, FIGS. 5-17C are simplified for a better understanding of the concepts of the present disclosure. Although the figures illustrate the memory device 300, it is understood the IC may include a number of other devices such as inductors, resistor, capacitors, transistors, etc., which are not shown in FIGS. 5-17C, for purposes of clarity of illustration.

Referring first to FIG. 4, in brief overview, the method 400 starts with operation 402 in which a substrate is provided. The method 400 proceeds to operation 404 in which an alternating series of first nanostructures and second nanostructures are formed. The method 400 proceeds to operation 406 in which an active region (including a first active sub-region and second active sub-region) is defined. The method 400 proceeds to operation 408 in which a number of dummy gate stacks are formed. The method 400 proceeds to operation 410 in which a number of alternating-nano structure columns are defined. The method 400 proceeds to operation 412 in which respective end portions of the first nanostructures are removed. The method 400 proceeds to operation 414 in which inner spacers are formed. The method 400 proceeds to operation 416 in which sources and drains are formed. The method 400 proceeds to operation 418 in which an inter-layer dielectric is deposited. The method 400 proceeds to operation 420 in which the dummy gate stacks are removed. The method 400 proceeds to operation 422 in which the first nanostructures are removed. The method 400 proceeds to operation 424 in which gate dielectrics are formed. The method 400 proceeds to operation 426 in which gate metals are formed.

Figure 5:
FIGS. 5, 6, 7A, 8A, 9A, 10, 11, 12A, 13, 14A, 15A, 16A, and 17A illustrate cross-sectional views of the memory device of FIG. 3, cut along line A-A', at various fabrication stages, in accordance with some embodiments.

Corresponding to operation 402, FIG. 5 is a cross-sectional view of the memory device 300, cut along line A-A' (FIG. 3), that includes the substrate 302, at one of the various stages of fabrication. The substrate 302 includes a semiconductor material substrate, for example, silicon. Alternatively, the substrate 302 may include other elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer. For example, the substrate may have an epitaxial layer overlying a bulk semiconductor. Furthermore, the substrate 302 may include a semiconductor-on-insulator (SOI) structure. For example, the substrate 302 may include a buried oxide (BOX) layer formed by a process such as separation by implanted oxygen (SIMOX) or other suitable technique, such as wafer bonding and grinding.

Figure 6:
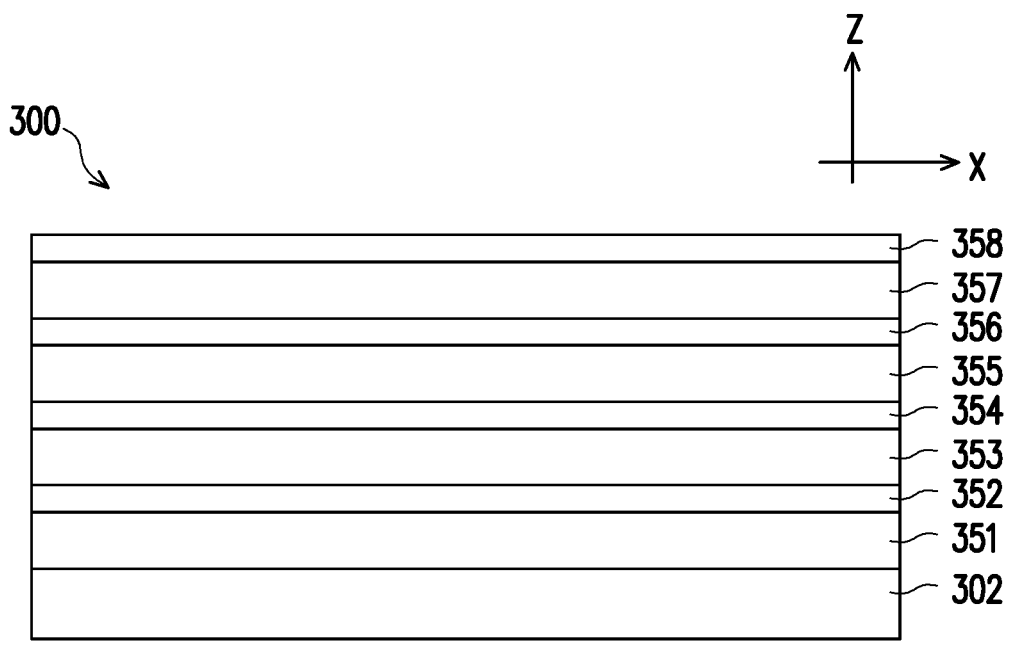

Corresponding to operation 404, FIG. 6 is a cross-sectional view of the memory device 300, cut along line A-A' (FIG. 3), that includes an alternating series of first nanostructures 351, 353, 355, and 357 and second nanostructures 352, 354, 356, and 358, at one of the various stages of fabrication. The first nanostructures 351, 353, 355, and 357 may include SiGe sacrificial nanostructures (hereinafter "SiGe sacrificial nanostructures 351, 353, 355, and 357"), and the second nanostructures 352, 354, 356, and 358 may include Si nanostructures (hereinafter "Si nanostructures 352, 354, 356, and 358"). The alternating series of SiGe sacrificial nanostructures 351, 353, 355, and 357, and the Si nanostructures 352, 354, 356, and 358 may be formed as a stack over the substrate 302. Such a stack may sometimes be referred to as a superlattice. In a non-limiting example, the SiGe sacrificial nanostructures 351, 353, 355, and 357 can be SiGe 25%. The notation "SiGe 25%" is used to indicate that 25% of the SiGe material is Ge. It is understood the percentage of Ge in each of the SiGe sacrificial nanostructures 351, 353, 355, and 357 can be any value between 0 and 100 (excluding 0 and 100), while remaining within the scope of the present disclosure. In some other embodiments, the nanostructures 352, 354, 356, and 358 may include a first semiconductor material other than Si and the nanostructures 351, 353, 355, and 357 may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

Figure 7A:
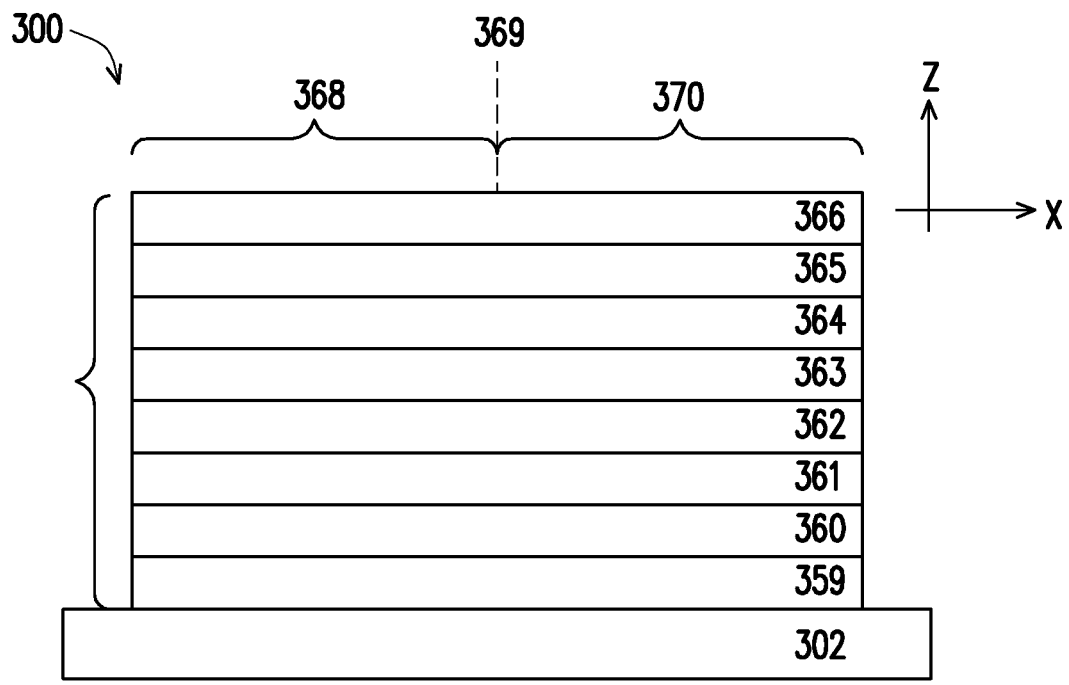
Figure 7B:
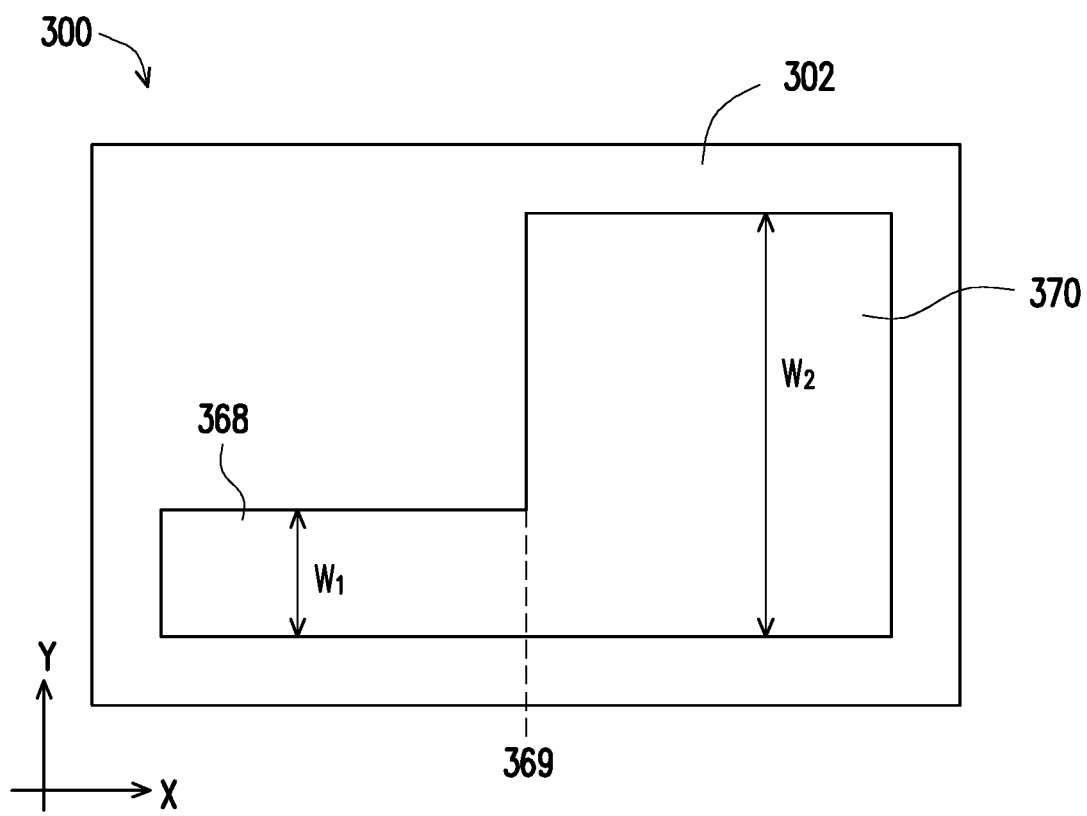
FIGS. 7B, 8B, 9B, and 12B illustrate top views of the memory device of FIG. 3 at various fabrication stages, in accordance with some embodiments.
Figure 7C:
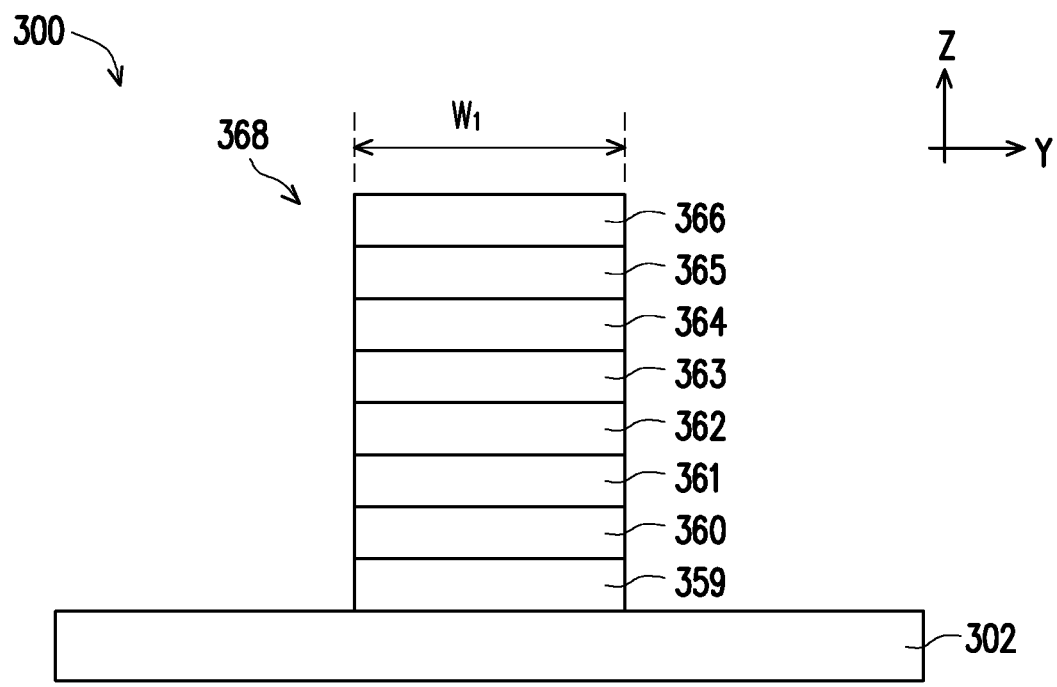
Figure 7D:
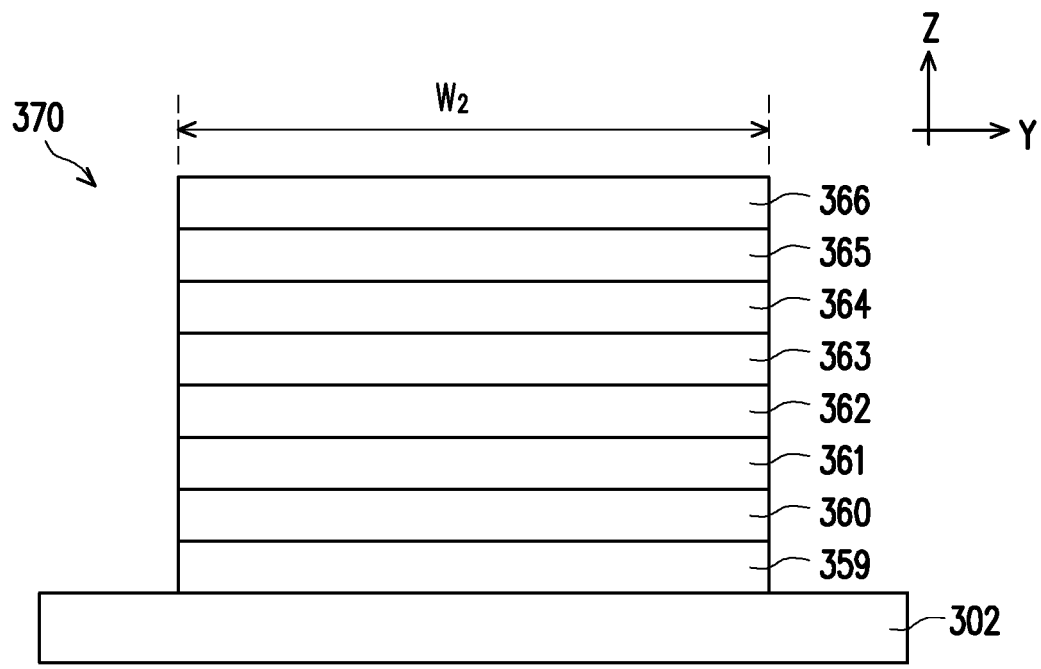

Corresponding to operation 406, FIG. 7A is a cross-sectional view of the memory device 300, cut along line A-A' (FIG. 3), that includes defined active sub-regions 368 and 370, at one of the various stages of fabrication. For purposes of illustration, FIGS. 7B, 7C, and 7D further provide a corresponding top view, a cross-sectional view cut along line B-B' (FIG. 3), and a cross-sectional view cut along line C-C' (FIG. 3) of the memory device 300, respectively, at this fabrication stage. As mentioned above, the memory device 300 may be formed based on the layout 260 shown in FIG. 2F. For example, the layout 260 may be used in a patterning process (e.g., a photolithography process) to form a mask over the nanostructures 351-358 (FIG. 6). The mask may have a geometry substantially similar to the feature 261 of the layout 260. The nanostructures 351-358 may then be etched using the mask to form the active sub-regions 368 and 370, as shown in FIGS. 7B to 7D. The active sub-region 368, corresponding to the sub-feature 261a (FIG. 2F), may be thus characterized with the width $W_1$ along the Y direction, and the active sub-region 370, corresponding to the sub-feature 261b (FIG. 2F), may thus be characterized with the width $W_2$ along the Y direction. Referring again to FIG. 7A, the "etched" SiGe nanostructure 359, Si nanostructure 360, SiGe nanostructure 361, Si nanostructure 362, SiGe nanostructure 363, Si nanostructure 364, SiGe nanostructure 365, and Si nanostructure 366, stacked on top of one another along the Z direction, may collectively constitute the active sub-regions 368 and 370. As such, a symbolic boundary (as indicated by dotted line 369 in FIGS. 7A and B) may be defined to differentiate the active sub-regions 368 and 370.

Figure 8A:
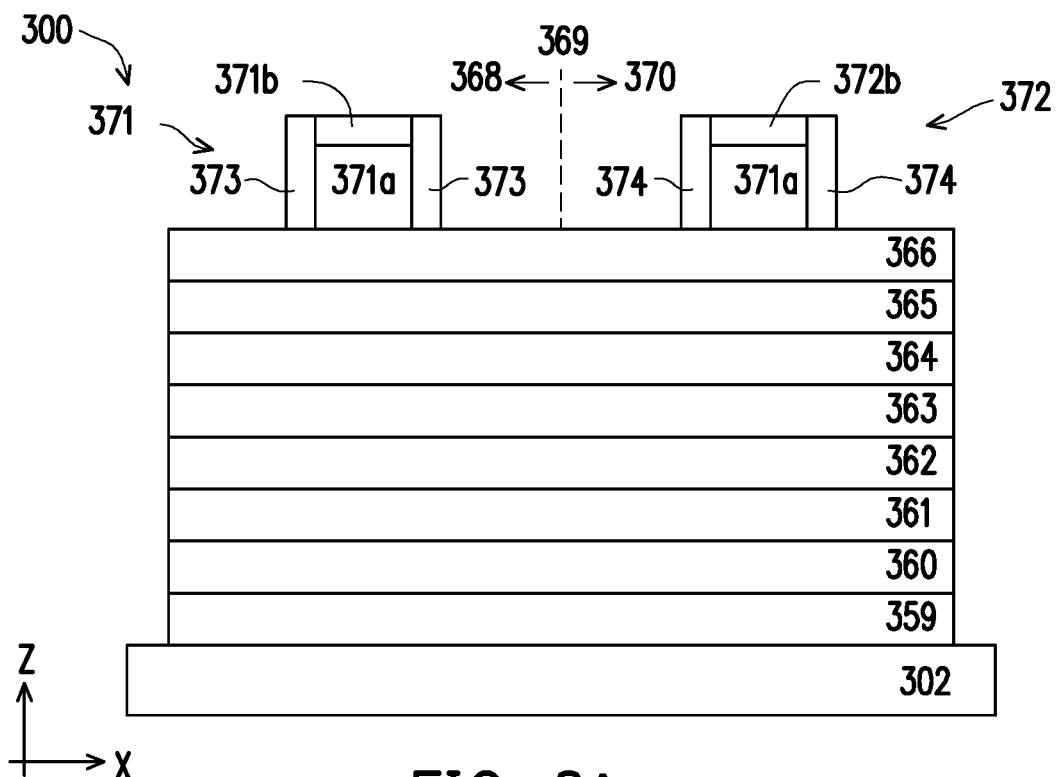

Corresponding to operation 408, FIG. 8A is a cross-sectional view of the memory device 300, cut along line A-A' (FIG. 3), that includes a first dummy gate stack 371 and second dummy gate stack 372, at one of the various stages of fabrication. For purposes of illustration, FIGS. 8B, 8C, and 8D further provide a corresponding top view, a cross-sectional view cut along line B-B' (FIG. 3), and a cross-sectional view cut along line C-C' (FIG. 3) of the memory device 300, respectively, at this fabrication stage. Each of the dummy gate stacks, 371 and 372, includes a dummy gate and a hard mask. For example in FIG. 8A, the first dummy gate stack 371 includes a dummy gate 371a formed over the Si nanostructure 366, and a hard mask 371b formed over the dummy gate 371a; and the second dummy gate stack 372 includes a dummy gate 372a formed over the Si nanostructure 366, and a hard mask 372b formed over the dummy gate 372a.

Figure 8B:
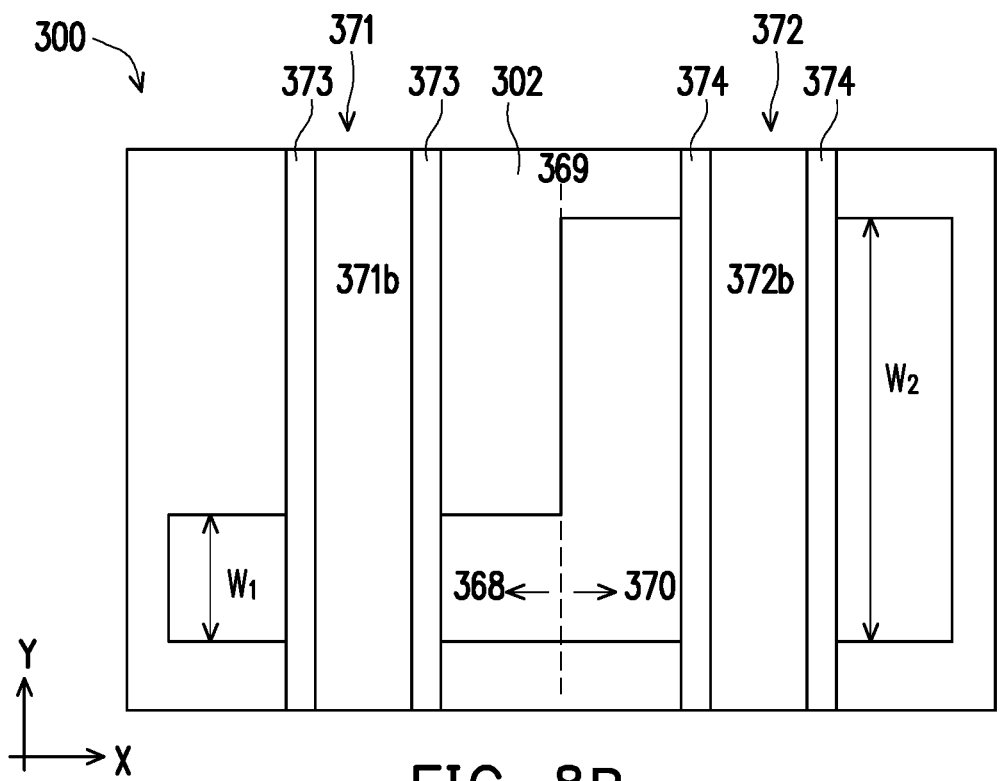
Figure 8C:
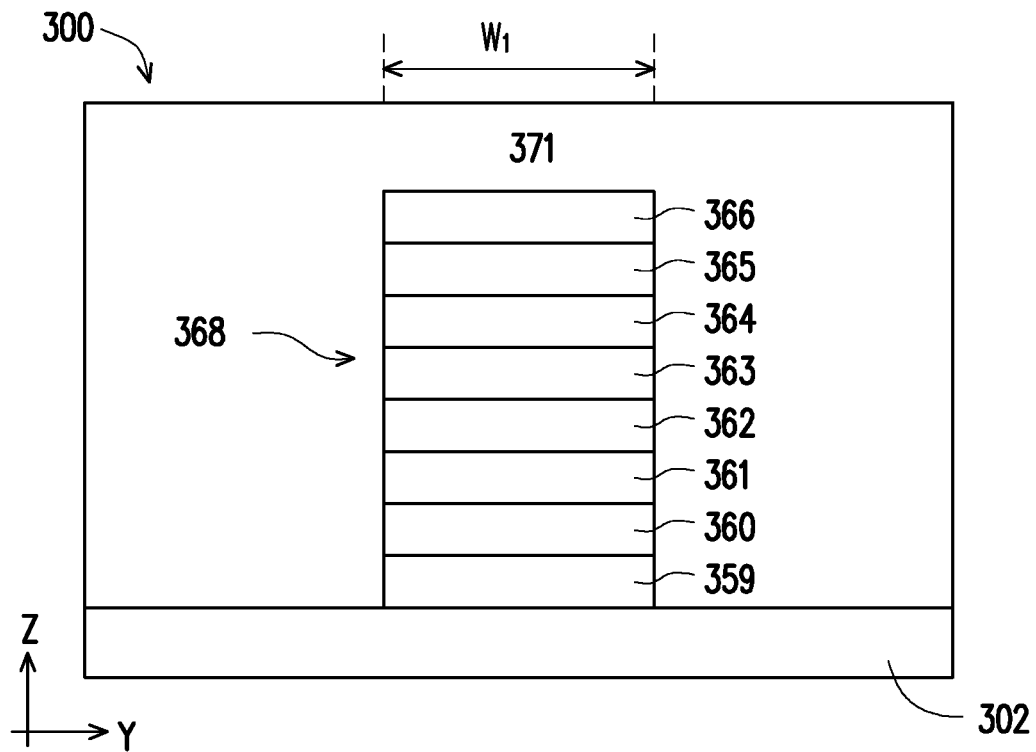
Figure 8D:
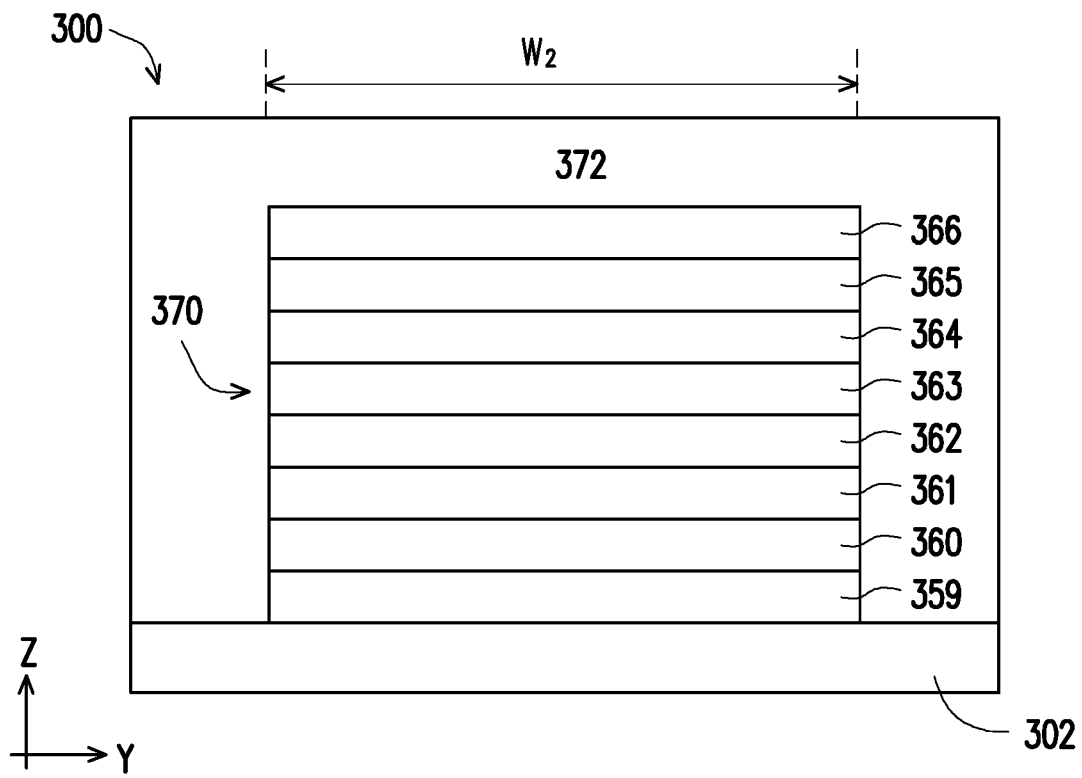

In some embodiments, the dummy gate stacks 371 and 372 correspond to the gate features 262 and 263 of the layout 260 (FIG. 2F), respectively. As such, the dummy gate stacks 371 and 372, extending along the Y direction, may be formed over the active sub-regions 368 and 370, respectively, as illustrated in FIGS. 8B to 8D. Specifically, the dummy gate stack 371 may be formed over and around sidewalls of the active sub-region 368, and the dummy gate 372 may be formed over and around sidewalls of the active sub-region 370, as shown in the top view of FIG. 8B. The dummy gates 371a and 372a can be formed by depositing amorphous silicon (a-Si) over and around the active sub-regions 368 and 370. Other materials suitable for forming dummy gates (e.g., polysilicon) can be used while remaining within the scope of the present disclosure. The a-Si is then planarized to a desired level. A hard mask (not shown) is deposited over the planarized a-Si and patterned (e.g., according to the gate features 262 and 263 of the layout 260 (FIG. 2F)) to form the hard masks 371b and 372b. The hard masks 371b and 372b can be formed from a nitride or an oxide layer. An etching process (e.g., a reactive-ion etching (RIE) process) is applied to the a-Si to form the dummy gate stacks 371 and 372.

After forming the dummy gate stacks 371 and 372, offset gate spacers 373 and 374 may be formed to extend along respective sidewalls of the dummy gate stacks 371 and 372, as illustrated in FIGS. 8A to 8B. The offset gate spacers 373 and 374 can be formed using a spacer pull down formation process. The offset gate spacers 373 and 374 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

Figure 9A:
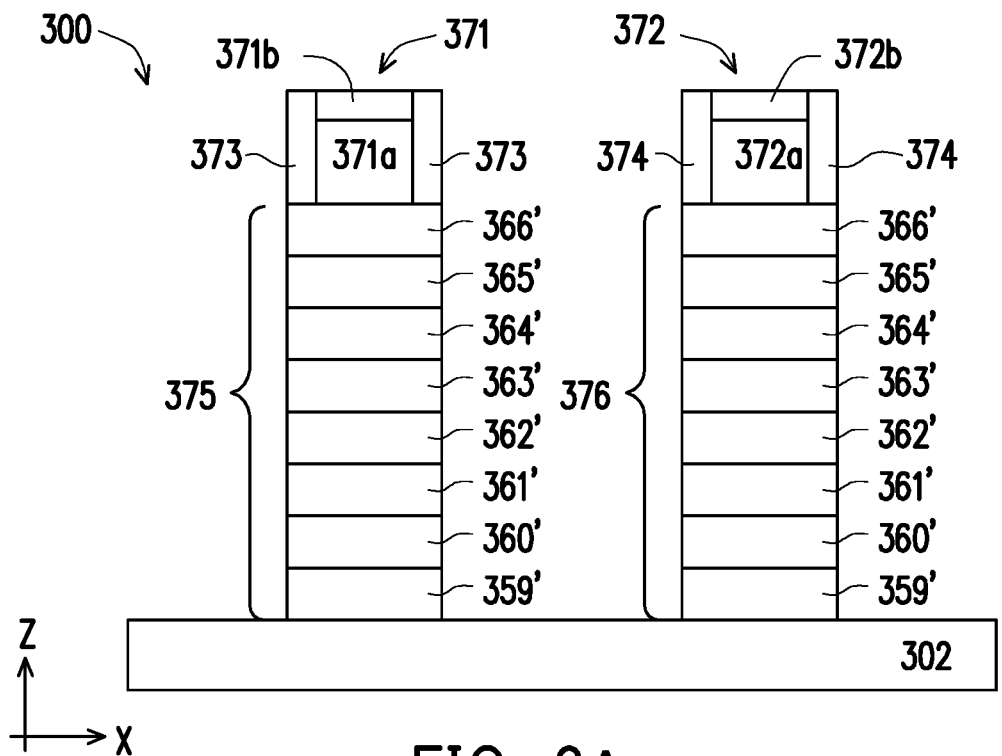

Corresponding to operation 410, FIG. 9A is a cross-sectional view of the memory device 300, cut along line A-A' (FIG. 3), that includes alternating-nanostructure columns 375 and 376, at one of the various stages of fabrication. For purposes of illustration, FIG. 9B further provides a corresponding top view of the memory device 300 at this fabrication stage. Subsequently to forming the offset gate spacers 373 and 374, the alternating-nanostructure columns 375 and 376 may be formed from the active sub-regions 368 and 370, respectively. In the formation of the alternating-nanostructure columns 375 and 376, the offset gate spacers 373 and 374, the dummy gates 371a and 372a, and the hard masks 371b and 372b can be used as a mask to define the footprint of the alternating-nanostructure columns 375 and 376, and an etching process can be applied to the active sub-regions 368 and 370 (enclosed by a dotted line in FIG. 9-2) to form the alternating-nanostructure columns 375 and 376.

Figure 9B:
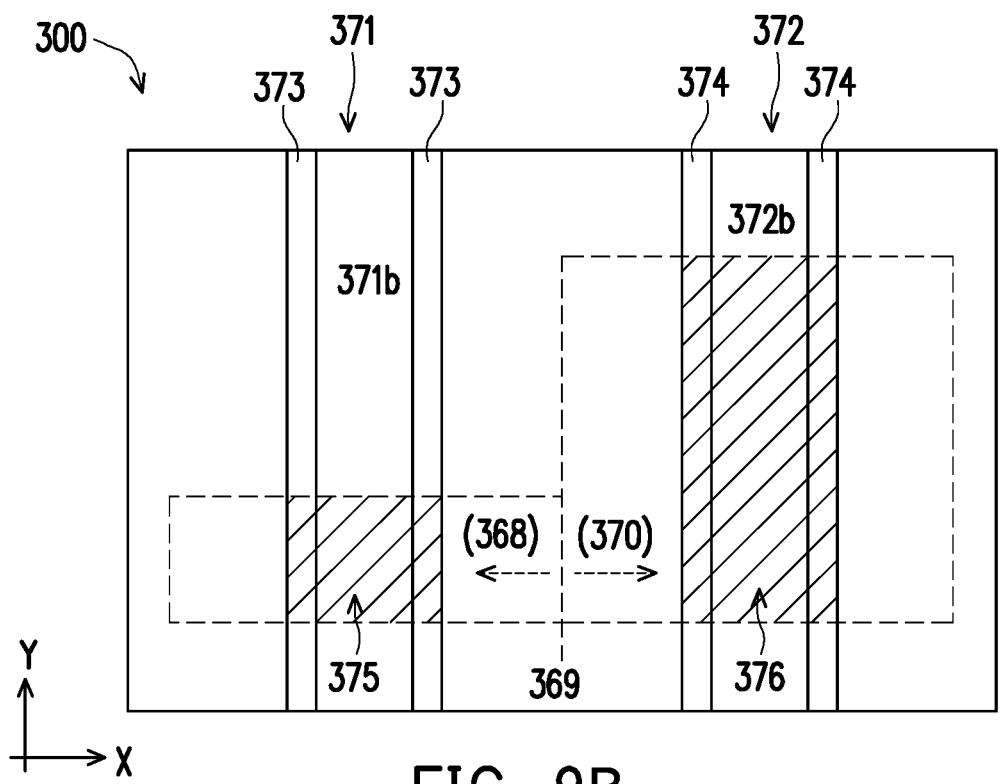

As illustrated in FIGS. 9A to 9B, the alternating-nanostructure column 375 (shaded by a diagonal pattern in FIG. 9B) is overlaid by the dummy gate stack 371 and the offset gate spacer 373; and the alternating-nanostructure column 376 (shaded by a diagonal pattern in FIG. 9B) is overlaid by the dummy gate stack 372 and the offset gate spacer 374. The alternating-nanostructure column 375 is positioned in a region of the substrate 302 where the programming transistor 350a (shown in FIG. 3) will be formed, and the alternating-nanostructure column 376 is positioned in a region of the substrate 302 where the reading transistor 350b (shown in FIG. 3) will be formed. Each of the alternating-nanostructure columns 375 and 376 includes a stack of alternating "defined" SiGe/Si nanostructures. For example, each of the alternating-nanostructure columns 375 and 376 includes a stack of alternating defined SiGe nanostructure 359', defined Si nano structure 360', defined SiGe nano structure 361', defined Si nano structure 362', defined SiGe nano structure 363', defined Si nano structure 364', defined SiGe nano structure 365', and defined Si nano structure 366'.

In some embodiments, when no extended source/drain junctions are formed, the defined Si nanostructures 360', 362', 364', and 366' of the alternating-nanostructure column 375 may correspond to the nanostructures 306d, 306c, 306b, and 306a (shown in FIG. 3), respectively; and the defined Si nanostructures 360', 362', 364', and 366' of the alternating-nanostructure column 376 may correspond to the nanostructures 316d, 316c, 316b, and 316a (shown in FIG. 3), respectively.

Figure 10:
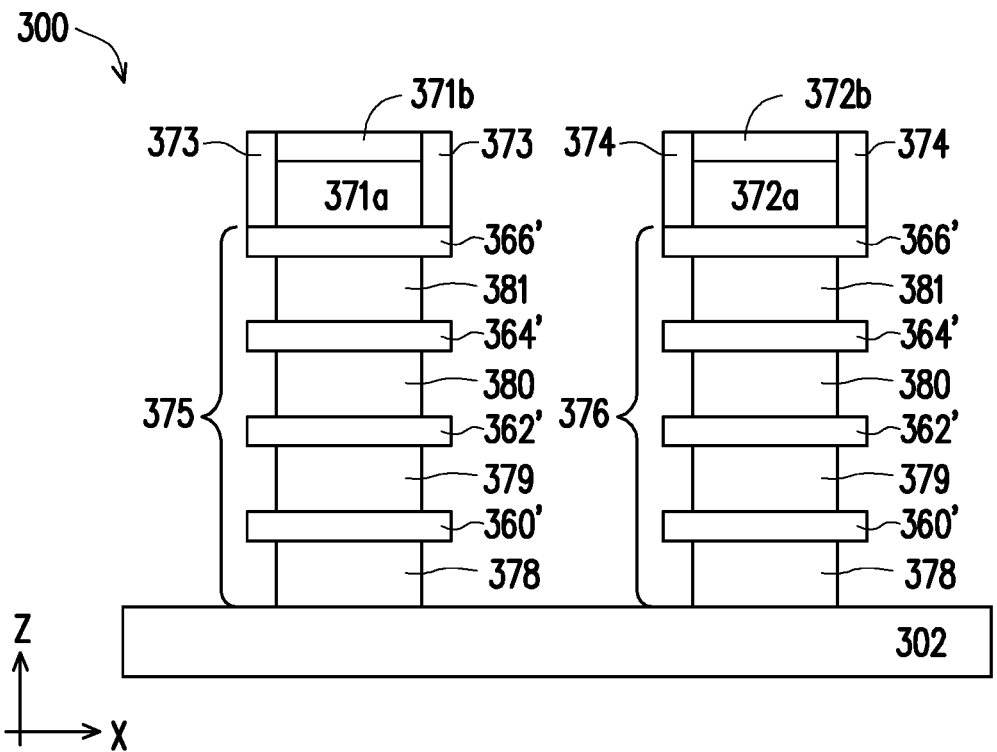

Corresponding to operation 412, FIG. 10 is a cross-sectional view of the memory device 300, cut along line A-A' (FIG. 3), in which respective end portions of each of the defined SiGe nano structure 359', defined SiGe nano structure 361', defined SiGe nano structure 363', and defined SiGe nanostructure 365' are removed, at one of the various stages of fabrication. As such, etched SiGe sacrificial nanostructures 378, 379, 380, and 381 can be formed. In some embodiments of present disclosure, the end portions of the defined SiGe nanostructures 359', 361', 363', and 365' can be removed using a first application, so called a "pull-back" process to pull the defined SiGe nanostructures 359', 361', 363', and 365' back an initial pull-back distance such that the ends of the etched SiGe sacrificial nanostructures 378, 379, 380, and 381 terminate underneath the offset gate spacers 373 and 374. The pull-back process may include a hydrogen chloride (HCL) gas isotropic etch process, which etches SiGe without attacking Si.

Figure 11:
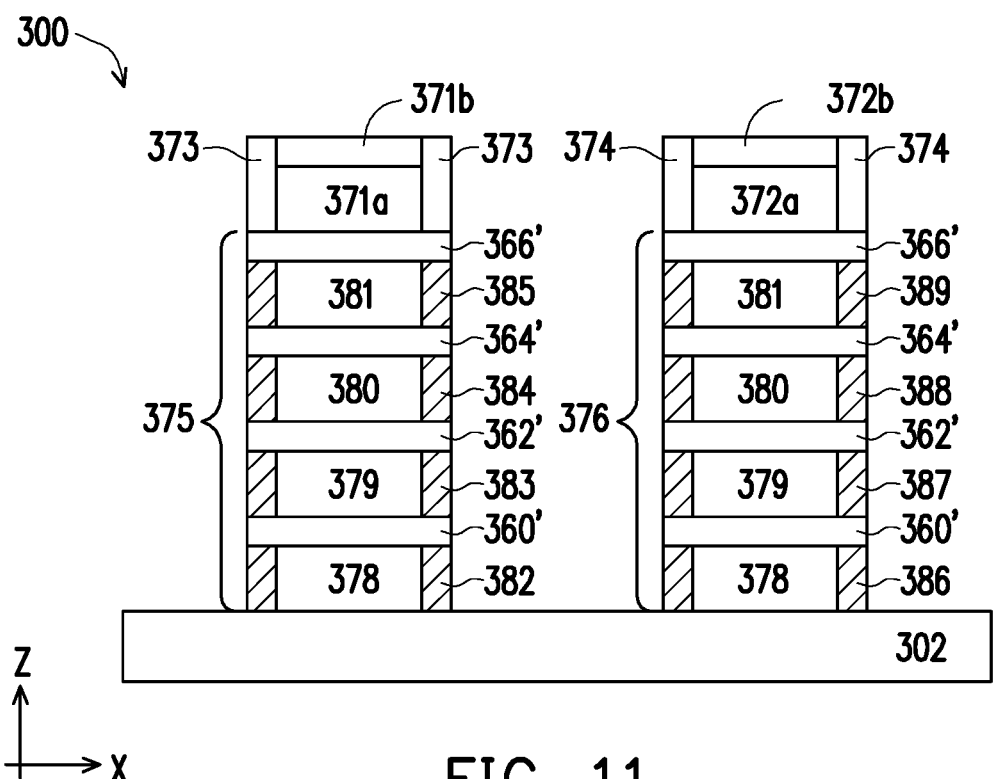

Corresponding to operation 414, FIG. 11 is a cross-sectional view of the memory device 300, cut along line A-A' (FIG. 3), that includes inner spacers 382, 383, 384, 385, 386, 387, 388, and 389, at one of the various stages of fabrication. In some embodiments, the inner spacers 382-389 can be formed conformally by chemical vapor deposition (CVD), or by monolayer doping (MLD) of nitride followed by spacer RIE. In some other embodiments, the inner spacers 382-389 can be deposited using, e.g., a conformal deposition process and subsequent isotropic or anisotropic etch back to remove excess spacer material on vertical sidewalls of the alternating-nanostructure columns 375 and 376 and on a surface of the semiconductor substrate 302. A material of the inner spacers 382-389 can be formed from the same or different material as the offset gate spacers 373 and 374 (e.g., silicon nitride). For example, the inner spacers 382-389 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of FET devices.

Figure 12A:
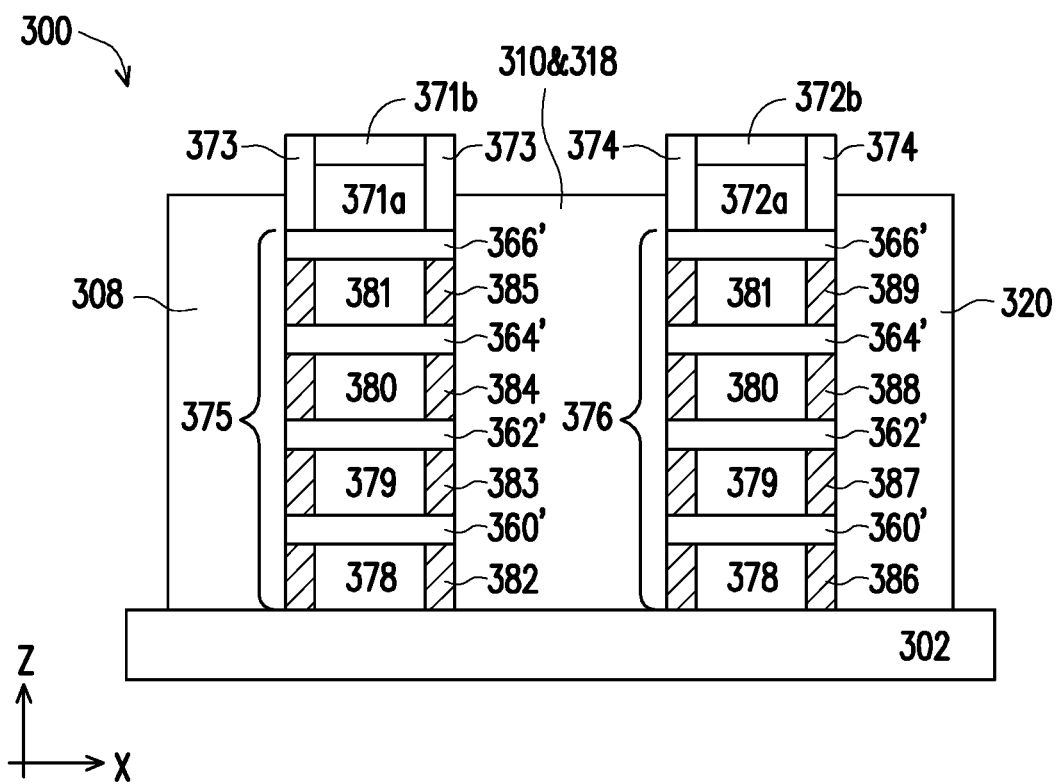
Figure 12B:
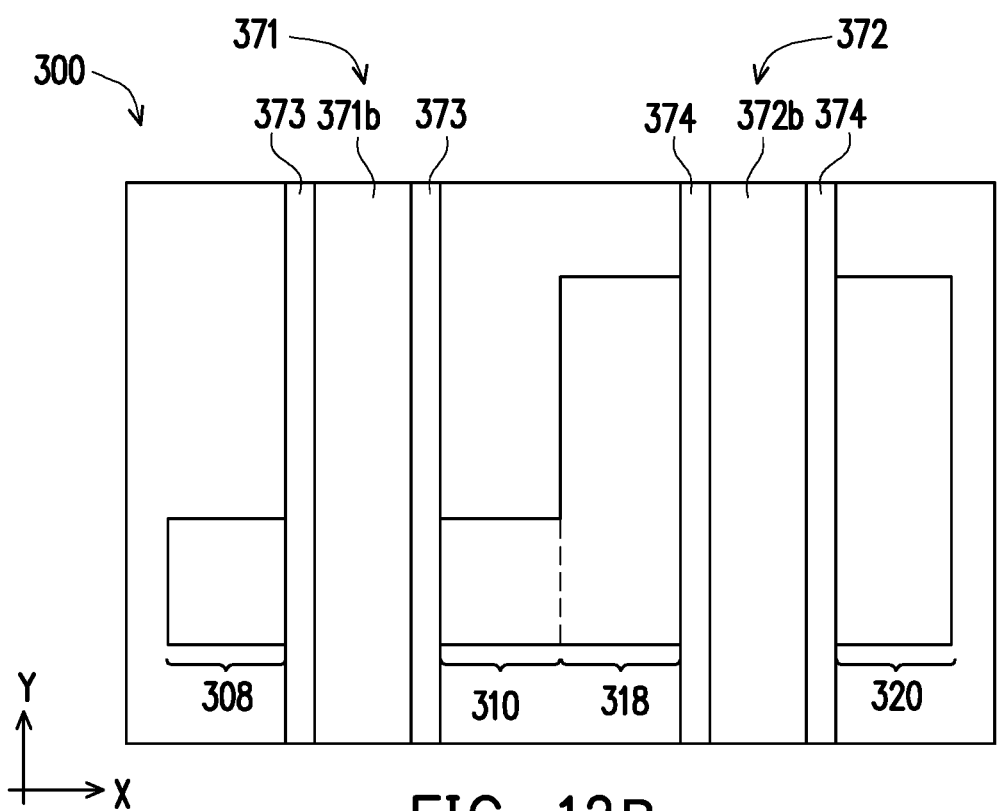

Corresponding to operation 416, FIG. 12A is a cross-sectional view of the memory device 300, cut along line A-A' (FIG. 3), that includes the drain 308, the source 310, the drain 318, and the source 320, at one of the various stages of fabrication. For purposes of illustration, FIG. 12B further provides a corresponding top view of the memory device 300 at this fabrication stage. In some embodiments of the present disclosure, the drain 308 may be formed using an epitaxial layer growth process on the exposed ends of the defined Si nanostructures 360', 362', 364', and 366' of the alternating-nanostructure column 375 in a region of the substrate 302 on the left-hand side of the dummy gate stack 371, as illustrated in FIG. 12B. The source 310 may be formed using an epitaxial layer growth process on the exposed ends of the defined Si nanostructures 360', 362', 364', and 366' of the alternating-nanostructure column 375 in a region of the substrate 302 on the right-hand side of the dummy gate stack 371, as illustrated in FIG. 12B. The drain 318 may be formed using an epitaxial layer growth process on the exposed ends of the defined Si nanostructures 360', 362', 364', and 366' of the alternating-nanostructure column 376 in a region of the substrate 302 on the left-hand side of the dummy gate stack 372, as illustrated in FIG. 12B. The source 320 is formed using an epitaxial layer growth process on the exposed ends of the defined Si nanostructures 360', 362', 364', and 366' in a region of the substrate 302 on the right-hand side of the dummy gate stack 372, as illustrated in FIG. 12B.

In some embodiments, the drain 308 and source 310 may be formed to follow a shape of the active sub-region 368, and the drain 318 and source 320 may be formed to follow a shape of the active sub-region 370 (FIG. 7B). Thus, the drain 308 and source 310 may be characterized with a width (along the Y direction) approximately about $W_1$, and the drain 318 and source 320 may be characterized with a width (along the Y direction) approximately about $W_2$. Further, the source 310 and drain 318 may merge together.

In-situ doping (ISD) may be applied to form doped drains/sources 308, 310, 318, and 320, thereby creating the necessary junctions for the programming transistor 350a and reading transistor 350b. N-type and p-type FETs are formed by implanting different types of dopants to selected regions (e.g., drains/sources 308, 310, 318, and 320) of the device to form the necessary junction(s). N-type devices can be formed by implanting arsenic (As) or phosphorous (P), and p-type devices can be formed by implanting boron (B).

Figure 13:
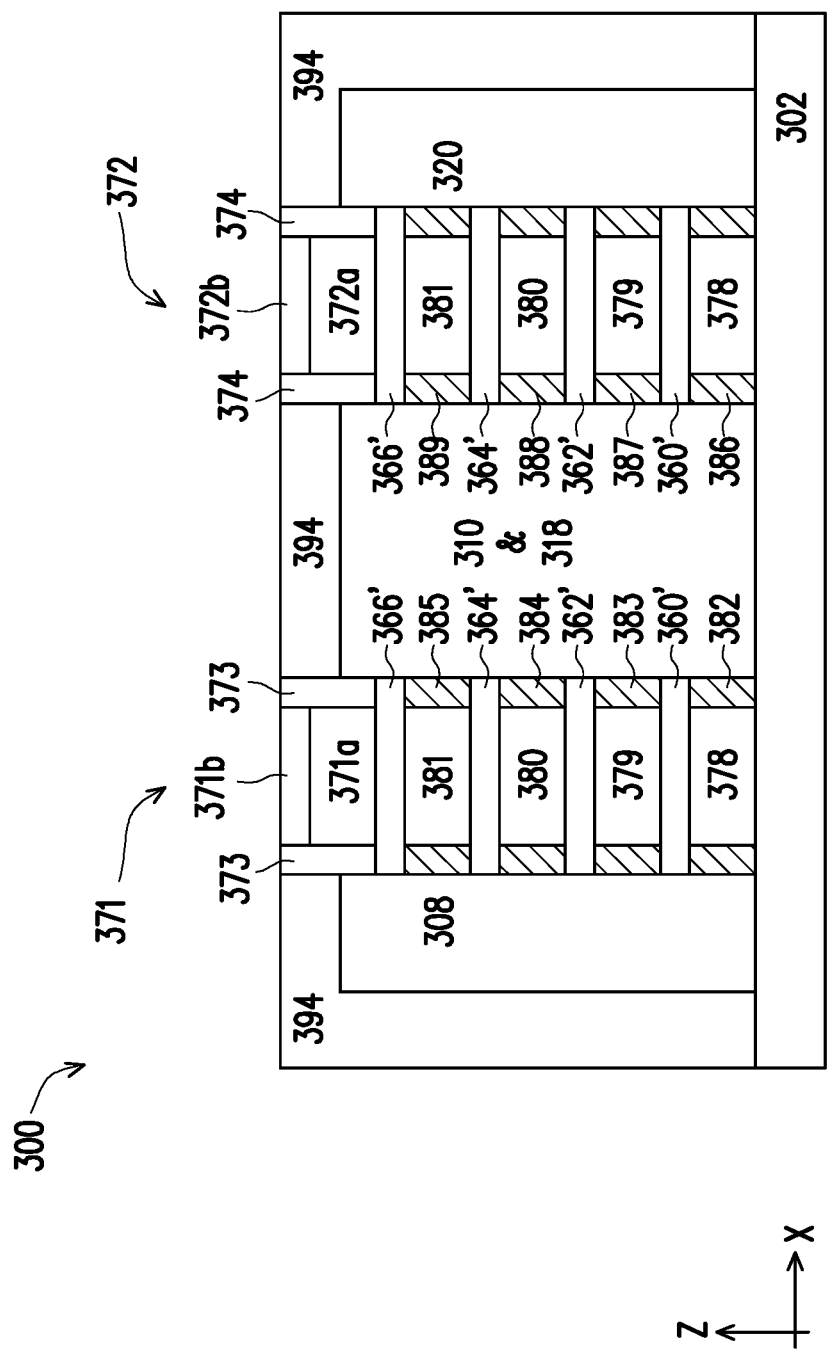

Corresponding to operation 418, FIG. 13 is a cross-sectional view of the memory device 300, cut along line A-A' (FIG. 3), that includes an inter-layer dielectric (ILD) material 394, at one of the various stages of fabrication. The ILD material 394 can be formed by depositing an oxide material in bulk (e.g., silicon dioxide) and polishing the bulk oxide back (e.g., using CMP) to the level of the offset gate spacers 373 and 374 and the hard masks 371b and 372b.

Figure 14A:
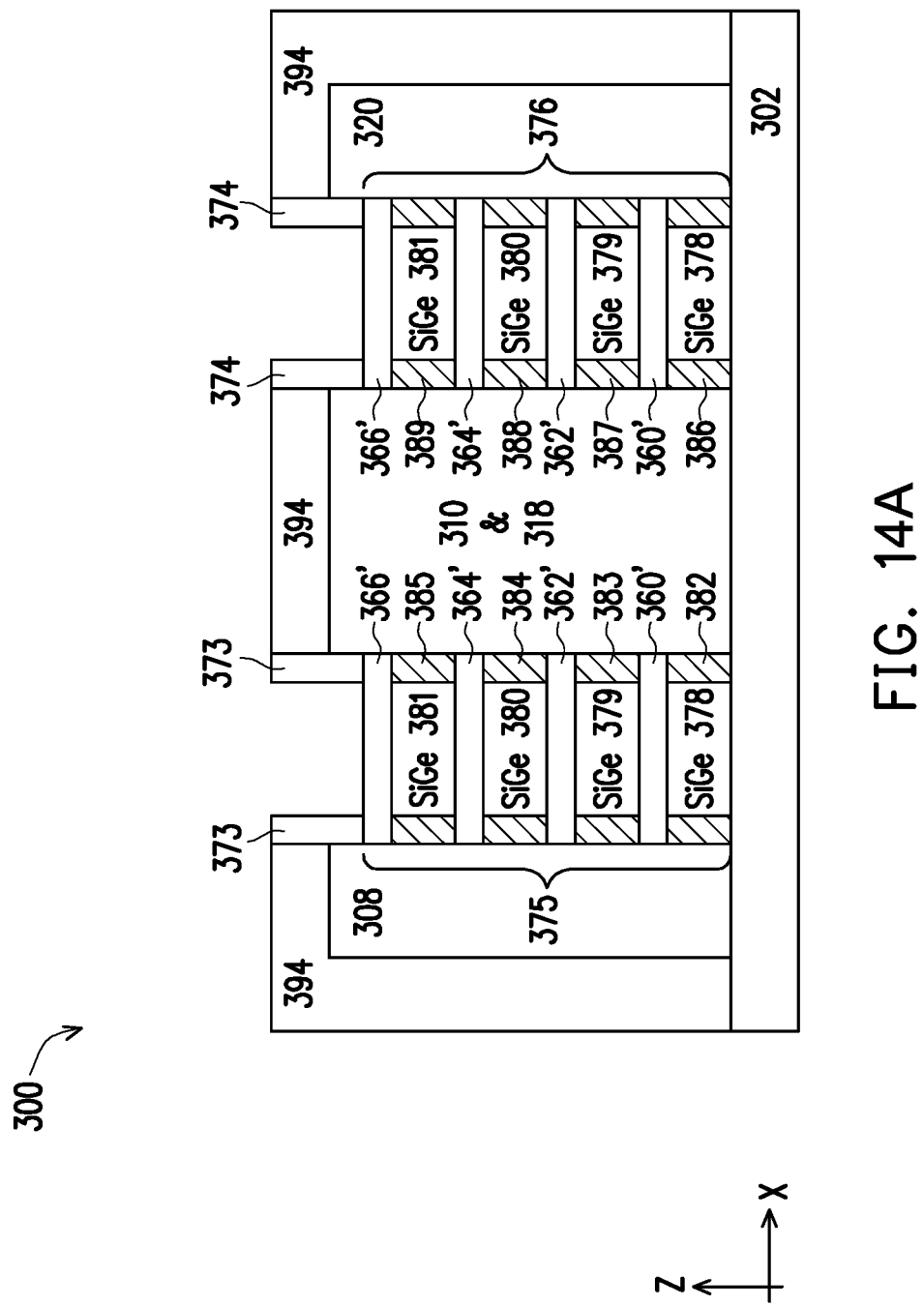

Corresponding to operation 420, FIG. 14A is a cross-sectional view of the memory device 300, cut along line A-A' (FIG. 3), in which the dummy gate stacks 371 and 372 (FIG. 13) are removed, at one of the various stages of fabrication. For purposes of illustration, FIGS. 14B and 14C further provide a cross-sectional view cut along line B-B' (FIG. 3), and a cross-sectional view cut along line C-C' (FIG. 3) of the memory device 300, respectively, at this fabrication stage. Subsequently to forming the protective ILD material 394, the dummy gate stacks 371 (including the dummy gate 371a and hard mask 371b) and 372 (including the dummy gate 372a and hard mask 372b), as illustrated in FIG. 13, are removed. The dummy gate stacks 371 and 372 can be removed by a known etching process, e.g., RIE or chemical oxide removal (COR).

Figure 14C:
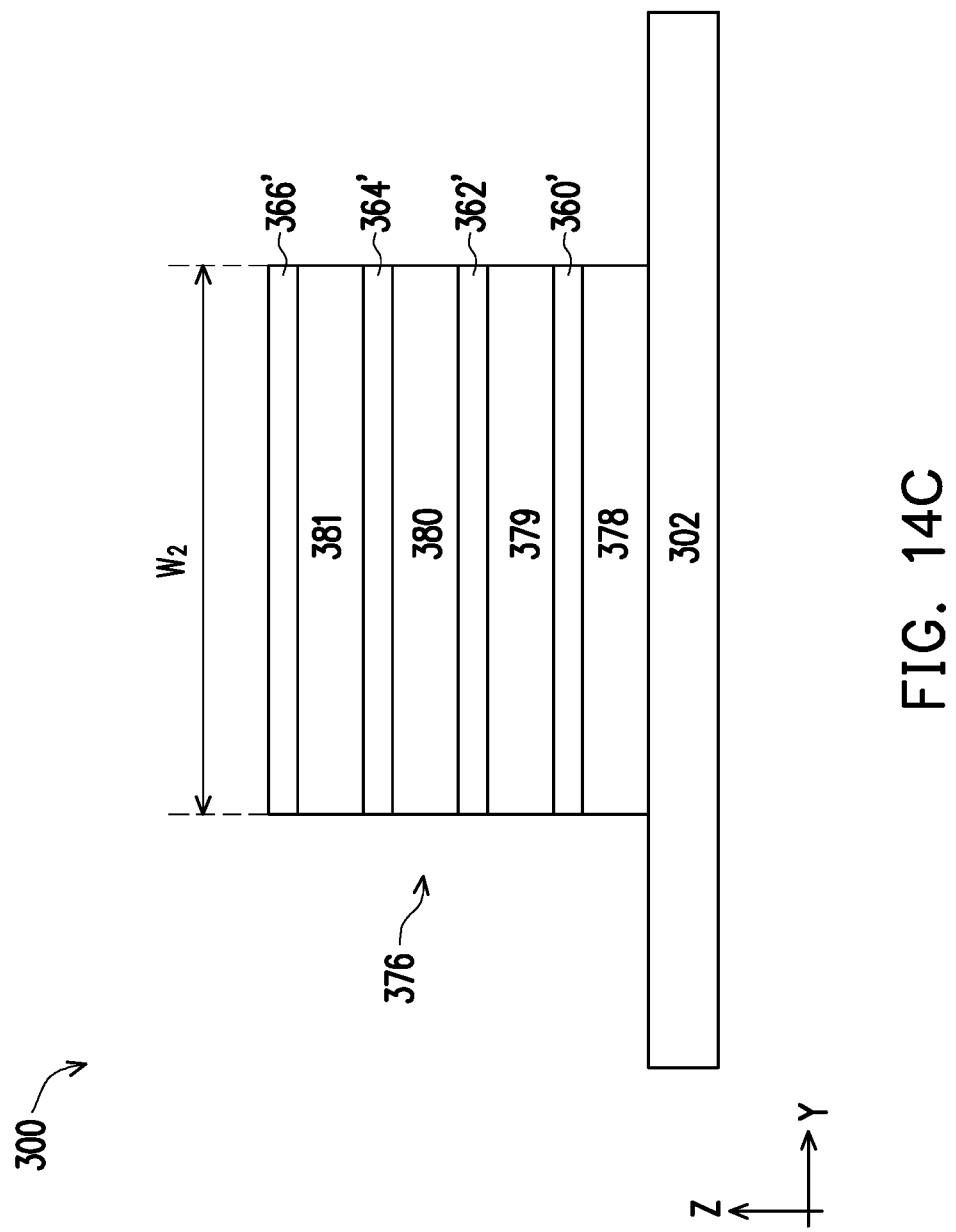

After the removal of the dummy gate stacks 371 and 372, respective top boundaries of the alternating-nanostructure columns 375 and 376 may be again exposed. Specifically, respective top boundaries of the defined Si nanostructures 366' of the alternating-nanostructure columns 375 and 376 may be exposed, as shown in FIG. 14A to 14C. In addition to the top boundaries, the respective sidewalls of the alternating-nanostructure columns 375 and 376, along the Y direction, may also be exposed, as illustrated in the cross-sectional views of FIGS. 14B to 14C.

Figure 15A:
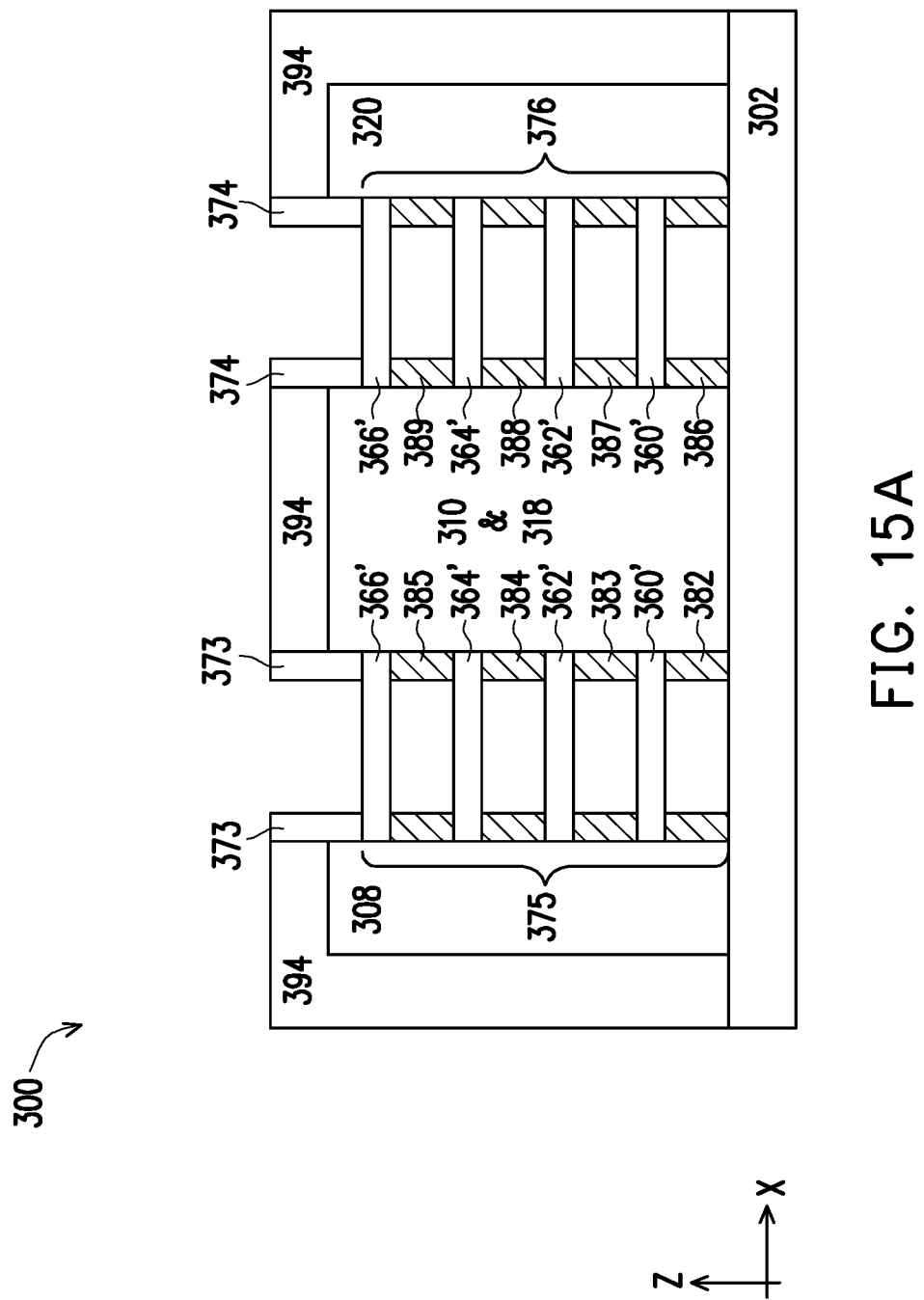
Figure 15:
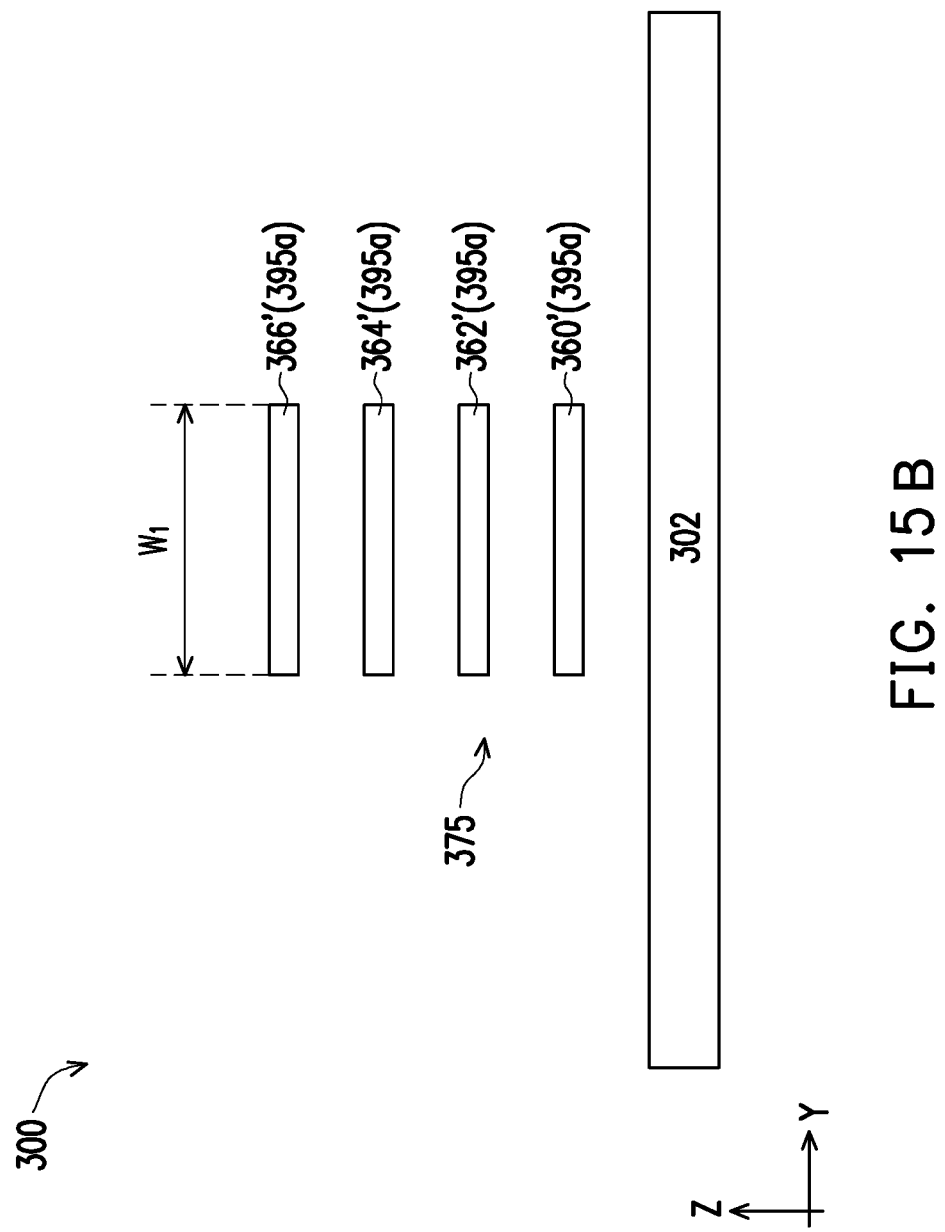

Corresponding to operation 422, FIG. 15A is a cross-sectional view of the memory device 300, cut along line A-A' (FIG. 3), in which the etched SiGe sacrificial nano-structures 378, 379, 380, and 381 (FIGS. 14A to 14C) are removed, at one of the various stages of fabrication. For purposes of illustration, FIGS. 15B and 15C further provide a cross-sectional view cut along line B-B' (FIG. 3), and a cross-sectional view cut along line C-C' (FIG. 3) of the memory device 300, respectively, at this fabrication stage. In some embodiments, the etched SiGe sacrificial nanostructures 378, 379, 380, and 381 of both of the alternating-nanostructure columns 375 and 376 are removed. The etched SiGe sacrificial nanostructures 378, 379, 380, and 381 can be removed by applying a selective etch (e.g., a hydrochloric acid (HCl)).

Figure 15C:
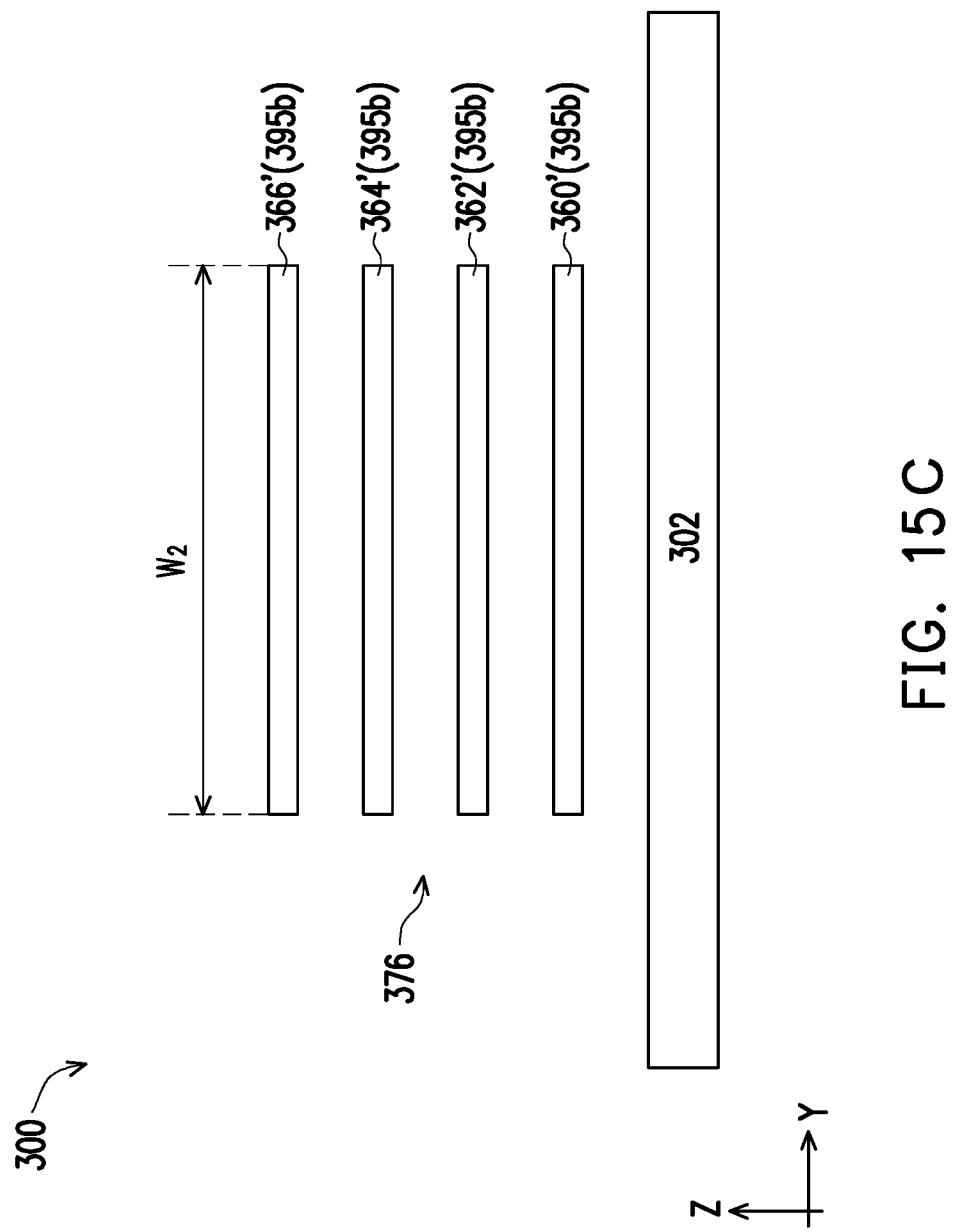

After the removal of the etched SiGe sacrificial nanostructures 378, 379, 380, and 381, respective bottom boundaries of the defined Si nanostructures 360', 362', 364', and 366' of both of the alternating-nanostructure columns 375 and 376 may be exposed, which are illustrated in the cross-sectional views of FIGS. 15B to 15C. It is noted that the bottom boundaries may be fully exposed when viewed along the X direction (e.g., FIGS. 15B to 15C), but partially exposed (because of the inner spacers 382-389) when viewed along the Y direction (FIG. 15A).

According to some embodiments of the present disclosure, the partially exposed defined Si nanostructures 360', 362', 364', and 366' of the alternating-nanostructure column 375 may be collectively configured as a conduction channel of the programming transistor 350a (FIG. 3); and the partially exposed defined Si nanostructures 360', 362', 364', and 366' of the alternating-nanostructure column 376 may be collectively configured as a conduction channel of the reading transistor 350b (FIG. 3). As such, the partially exposed defined Si nanostructures 360', 362', 364', and 366' of the alternating-nanostructure column 375 may herein be referred to as "conduction channel 395a;" and the partially exposed defined Si nanostructures 360', 362', 364', and 366' of the alternating-nanostructure column 376 may herein be referred to as "conduction channel 395b." The conduction channel 395a and 395b is configured to conduct current flowing through the programming transistor 305a and reading transistor 305b, respectively. In general, such a conduction channel has a length and a width. The length may be in parallel with the current, and the width may be in perpendicular to the current. As shown in FIGS. 15B to 15C, the conduction channel 395a may be characterized with a width of about $W_1$, and the conduction channel 395b may be characterized with a width of about $W_2$. Although four Si nanostructures are formed as the conduction channels of the programming transistor 305a and reading transistor 305b of the memory device 300, it is understood that a memory device, fabricated by the method disclosed herein, can include any number of nanostructures to form its conduction channel(s) while remaining within the scope of the present disclosure.

Figure 16A:
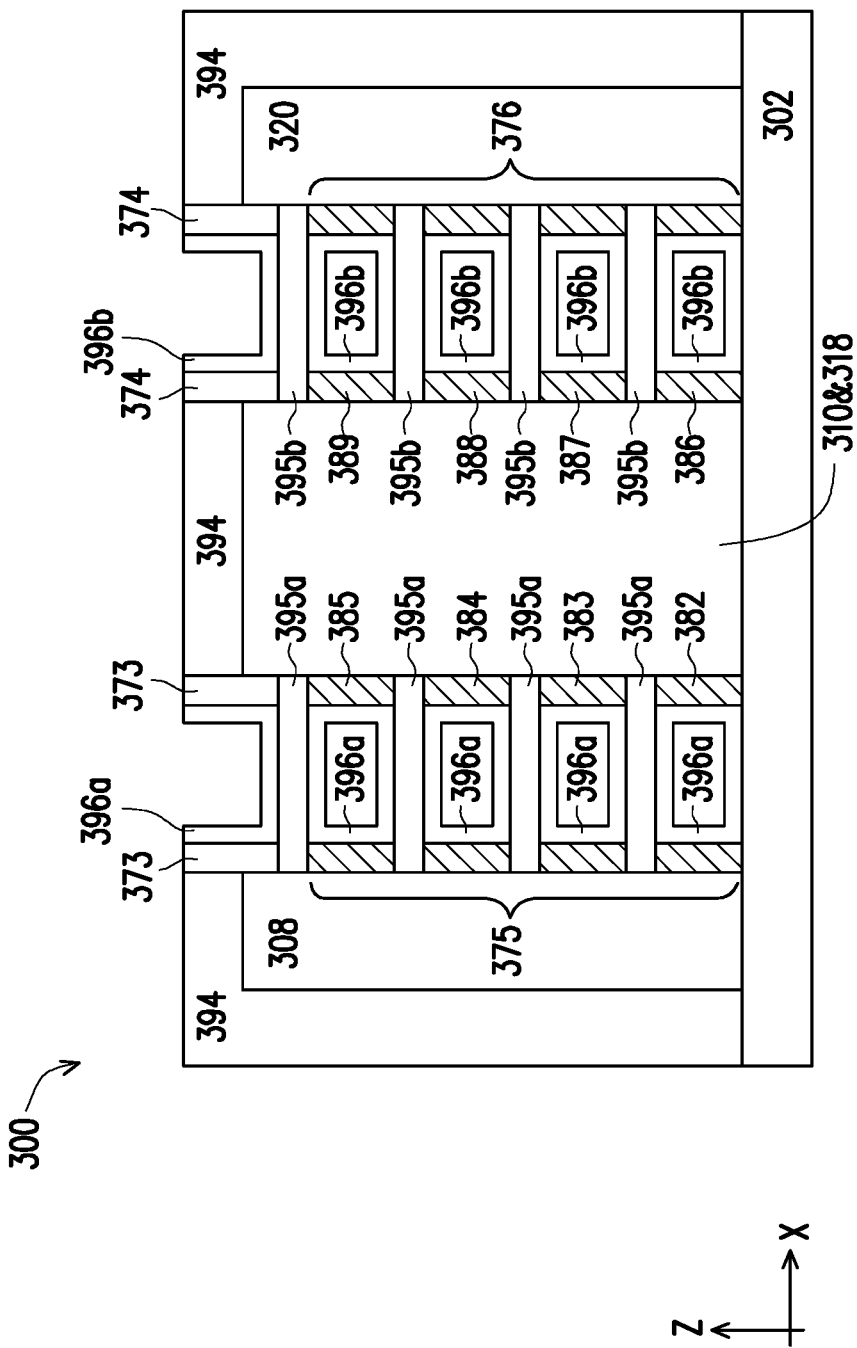
Figure 16B:
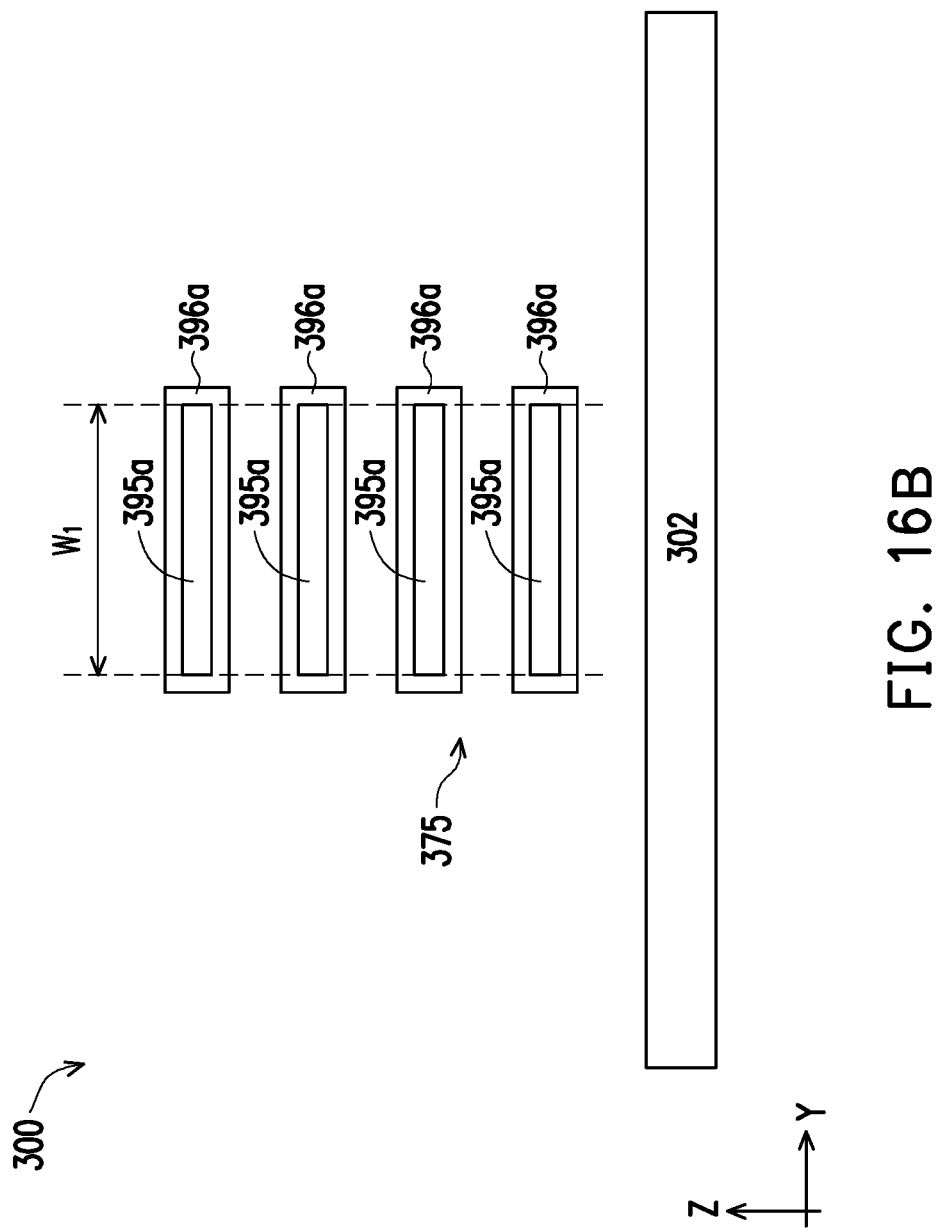
Figure 16C:
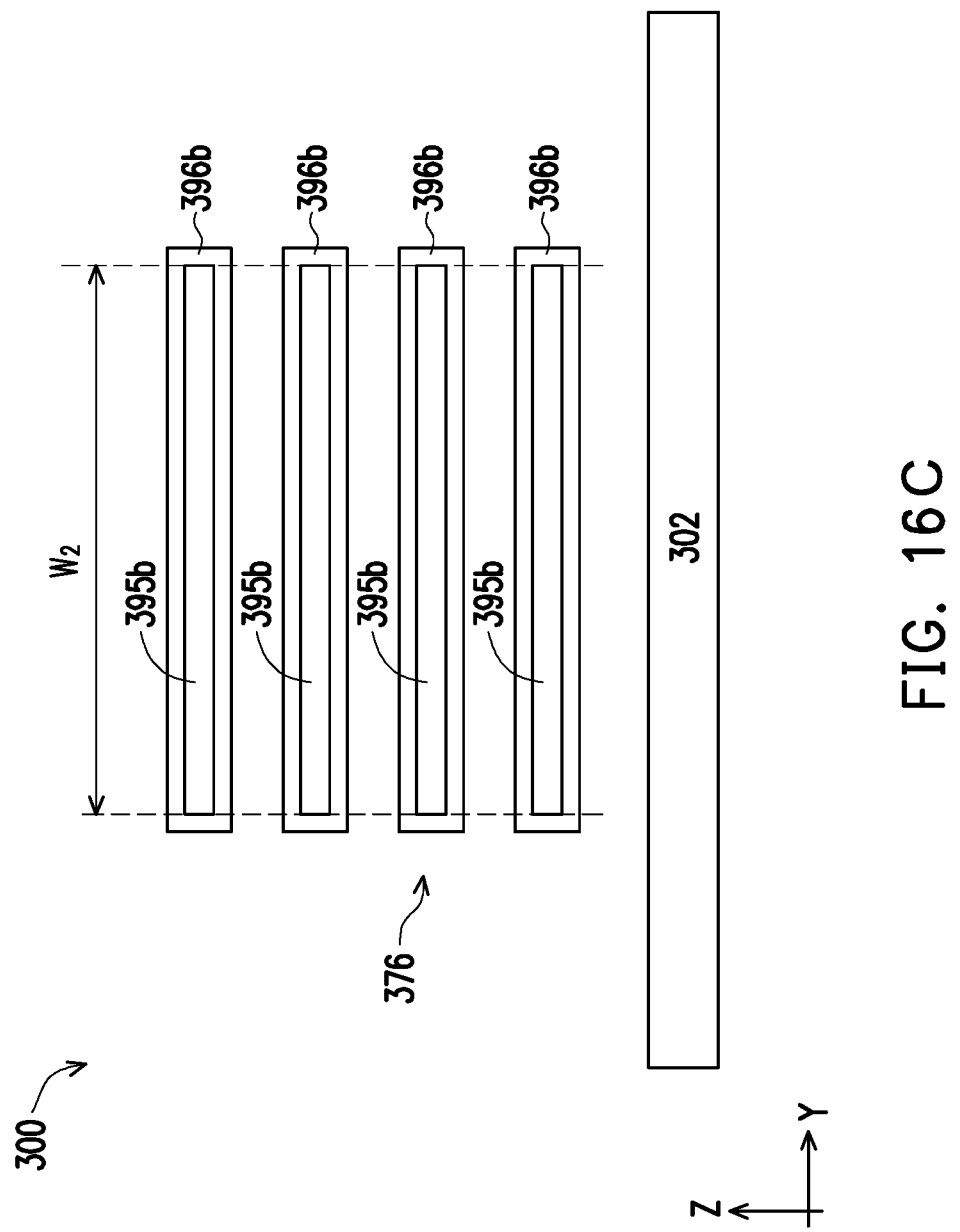

Corresponding to operation 424, FIG. 16A is a cross-sectional view of the memory device 300, cut along line A-A' (FIG. 3), that includes gate dielectrics 396a and 396b, at one of the various stages of fabrication. For purposes of illustration, FIGS. 16B and 16C further provide a cross-sectional view cut along line B-B' (FIG. 3), and a cross-sectional view cut along line C-C' (FIG. 3) of the memory device 300, respectively, at this fabrication stage. As shown in FIGS. 16A to 16C, the gate dielectric 396a can wrap around each of the Si nanostructures of the conduction channel 395a; and the gate dielectric 396b can wrap around each of the Si nanostructures of the conduction channel 395b. The gate dielectrics 396a and 396b may be formed of different high-k dielectric materials or an identical high-k dielectric material. The gate dielectrics 396a and 396b may include a stack of multiple high-k dielectric materials. The gate dielectrics 396a and 396b can be deposited using any suitable method, including, for example, atomic layer deposition (ALD). In some embodiments, the gate dielectrics 396a and 396b may optionally include a substantially thin oxide (e.g., $SiO_x$) layer.

Figure 17A:
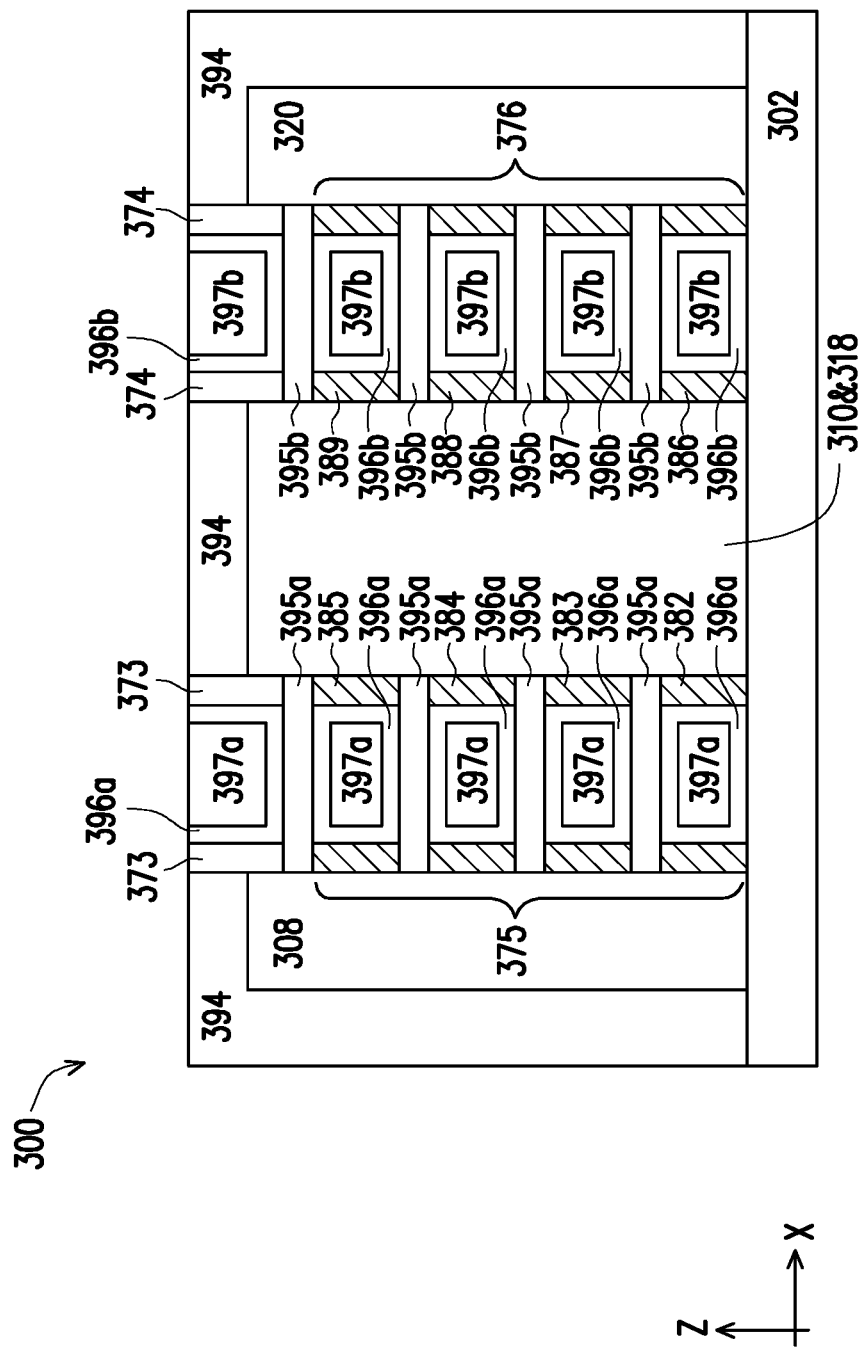
Figure 17B:
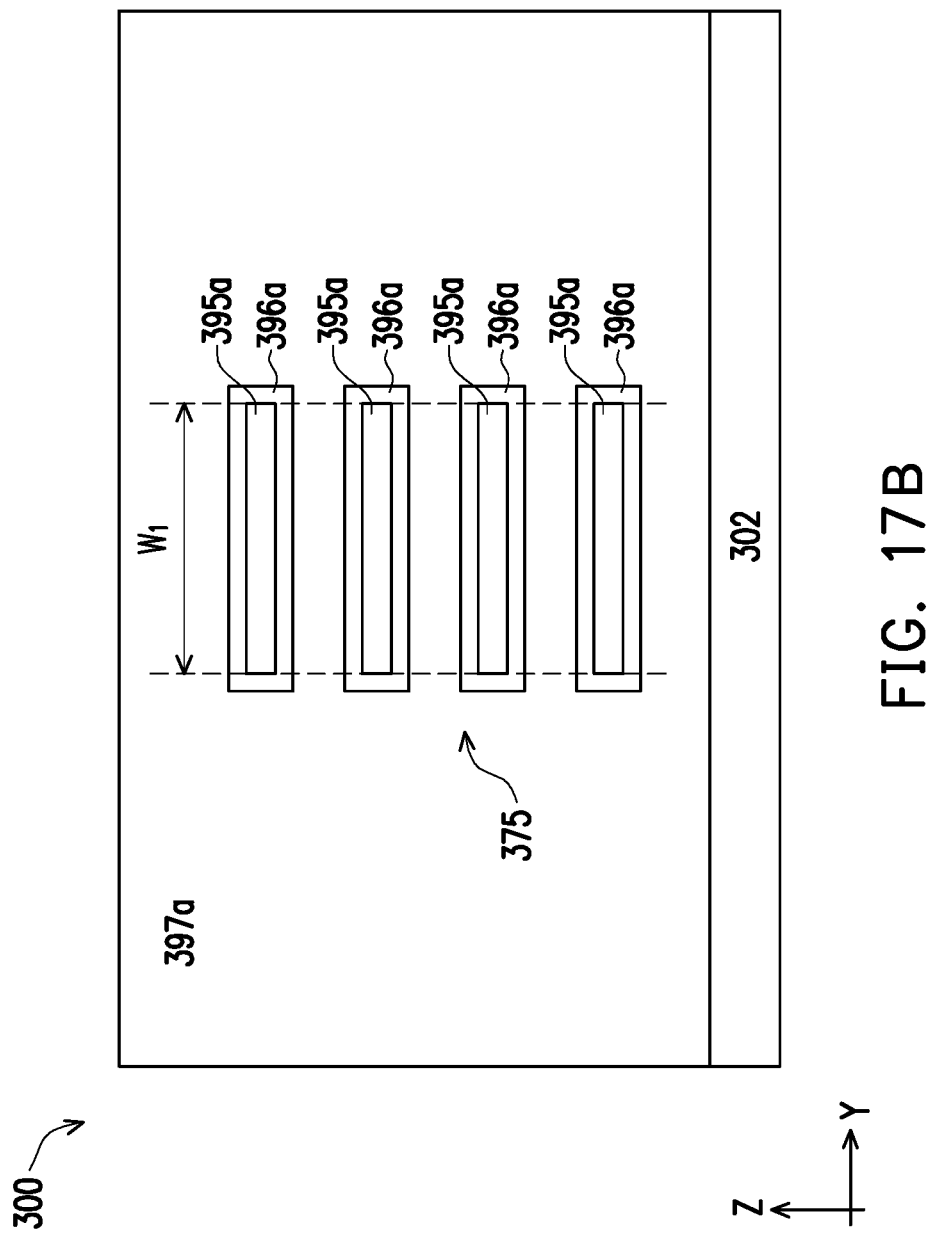

Corresponding to operation 426, FIG. 17A is a cross-sectional view of the memory device 300, cut along line A-A' (FIG. 3), that includes the gate metals 397a and 397b, at one of the various stages of fabrication. For purposes of illustration, FIGS. 17B and 17C further provide a cross-sectional view cut along line B-B' (FIG. 3), and a cross-sectional view cut along line C-C' (FIG. 3) of the memory device 300, respectively, at this fabrication stage. As shown in FIGS. 17A to 17C, the gate metal 397a can wrap around each of the Si nanostructures of the conduction channel 395a with the gate dielectric 396a disposed therebetween; and the gate metal 397b can wrap around each of the Si nanostructures of the conduction channel 395b with the gate dielectric 396b disposed therebetween. The gate metal 397a and 397b may be formed of different metal materials or an identical metal material. The gate metals 397a and 397a may include a stack of multiple metal materials. It is appreciated that the gate metals 397a-b may include any of other conductor materials while remaining within the scope of the present disclosure. The gates 397a and 397b can be deposited using any suitable method, including, for example, CVD. In some embodiments, the gate metal 397a, the corresponding gate dielectric 396a, and the offset gate spacers 373 may be collectively referred to as a gate structure, e.g., the gate structure 304 shown in FIG. 3. Similarly, the gate metal 397b, the corresponding gate dielectric 396b, and the offset gate spacers 374 may be collectively referred to as a gate structure, e.g., the gate structure 314 shown in FIG. 3.

In some embodiments, after forming the gate structures 304 and 314, one or more interconnection structures may be formed to connect each of the gate structure 304, the gate structure 314, and the source 320 to connect the memory device 300 to other components or devices. For example, one or more interconnection structures (e.g., a via structure typically known as VG) may be formed over the gate structure 304 to connect the gate structure 304 to one or more upper metal layers, which may include a programming word line (WLP); one or more interconnection structures (e.g., a metal structure typically known as MD, a via structure typically known as VD) may be formed over the gate structure 314 to connect the gate structure 314 to one or more upper metal layers, which may include a reading word line (WLR); and one or more interconnection structures (e.g., a via structure) may be formed through the ILD 394 and over the source 320 to connect the source 320 to one or more upper metal layers, which may include a bit line (BL). As such, the memory device 300, as an example anti-fuse memory cell, can be connected to one or more other memory cells similar to the memory device 300. For example, a number of such memory device 300 may be arranged (e.g., coupled) to each other by respective WLPs, reading WLs, and BLs to form a memory array.

The example memory device 300, discussed above in FIGS. 3 and 5 to 17C, is made based on the layout 260 of FIG. 2F. It is appreciated that other layouts discussed in FIGS. 2A to 2E may be used to form a memory device in any of various transistor device architectures. For example, when using the layout 200 in FIG. 2A to form the memory cell 100 (FIG. 1A) in the nanostructure transistor configuration, the memory cell 100 can include a first stack of nanostructures that constitute a portion of the programming transistor 110's conduction channel based on the central portion 205, a second stack of nanostructures that constitute another portion of the programming transistor 110's conduction channel based on the central portion 206, and a third stack of nanostructures that constitute the reading transistor 120's conduction channel based on the central portion 211. Each nanostructure of the first and second stacks may be characterized with a width of $W_1$, and each nanostructure of the third stack may be characterized with a width of $W_2$. In some embodiments, each nanostructure of one of the first, second, and third stacks may be in parallel with a corresponding nanostructure of other stacks.

Figure 18A:
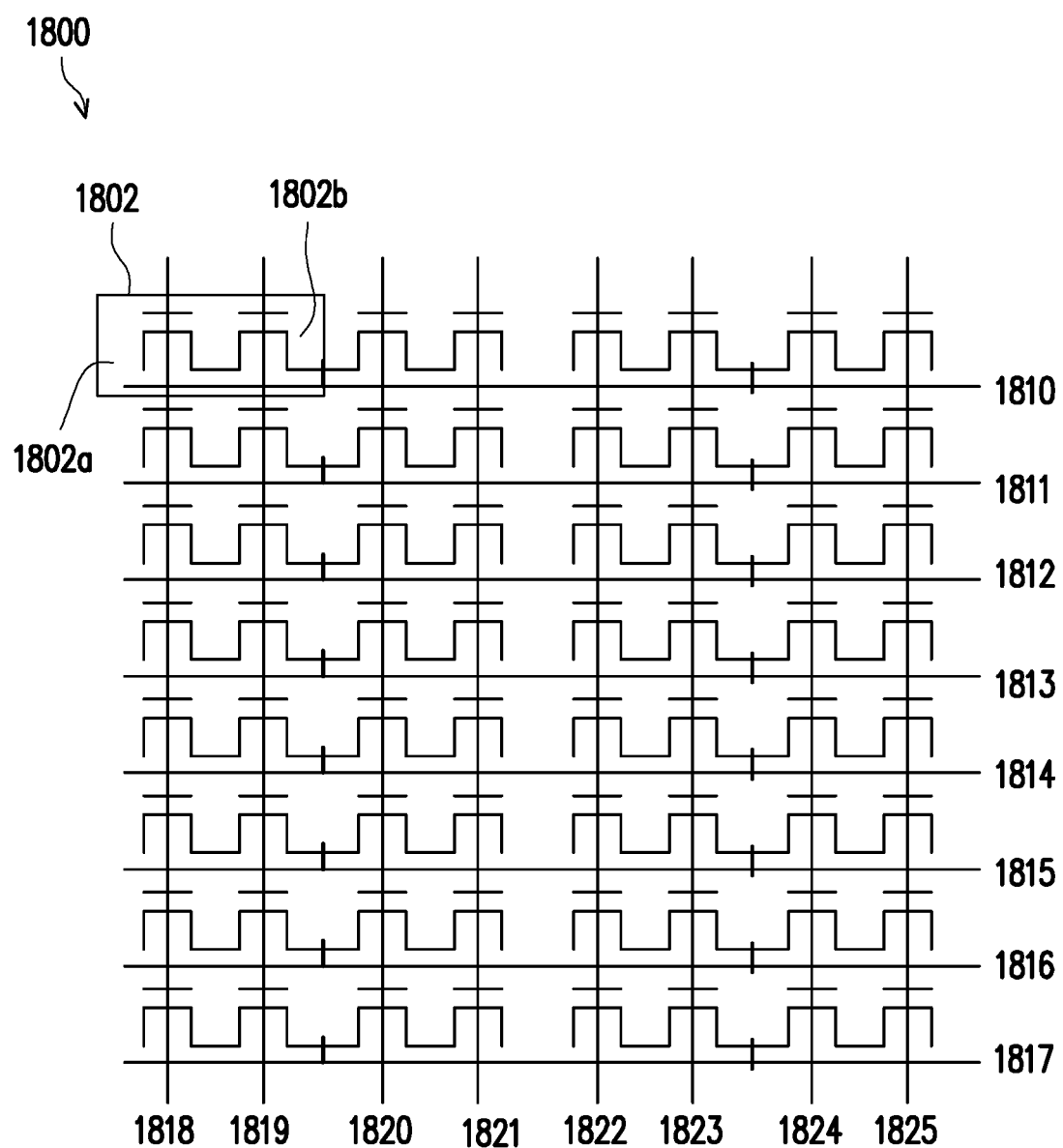
FIG. 18A illustrates an example circuit diagram of a memory array, in accordance with some embodiments.

FIG. 18A illustrates an example circuit diagram of a memory array 1800, in accordance with some embodiments. The memory array 1800 may include a number of memory cells 1802 coupled to each other via respective WLPs, WLRs, and BLs. In some embodiments, the memory cell may be substantially similar to the memory cell 100 shown in FIG. 1A. For example, each of the memory cells 1802 may include a programming transistor 1802a and a reading transistor 1802b, coupled to each other in series via a BL (e.g., 1810). Further, the programming transistor 1802a is gated by a WLP (e.g., 1818), and the reading transistor 1802b is gated by a WLR (e.g., 1819). As such, the memory array 1800 can include a number of BLs (e.g., 1810, 1811, 1812, 1813, 1814, 1815, 1816, 1817), a number of WLPs (e.g., 1818, 1820, 1822, 1824), and a number of WLRs (e.g., 1819, 1821, 1823, 1825).

Figure 18B:
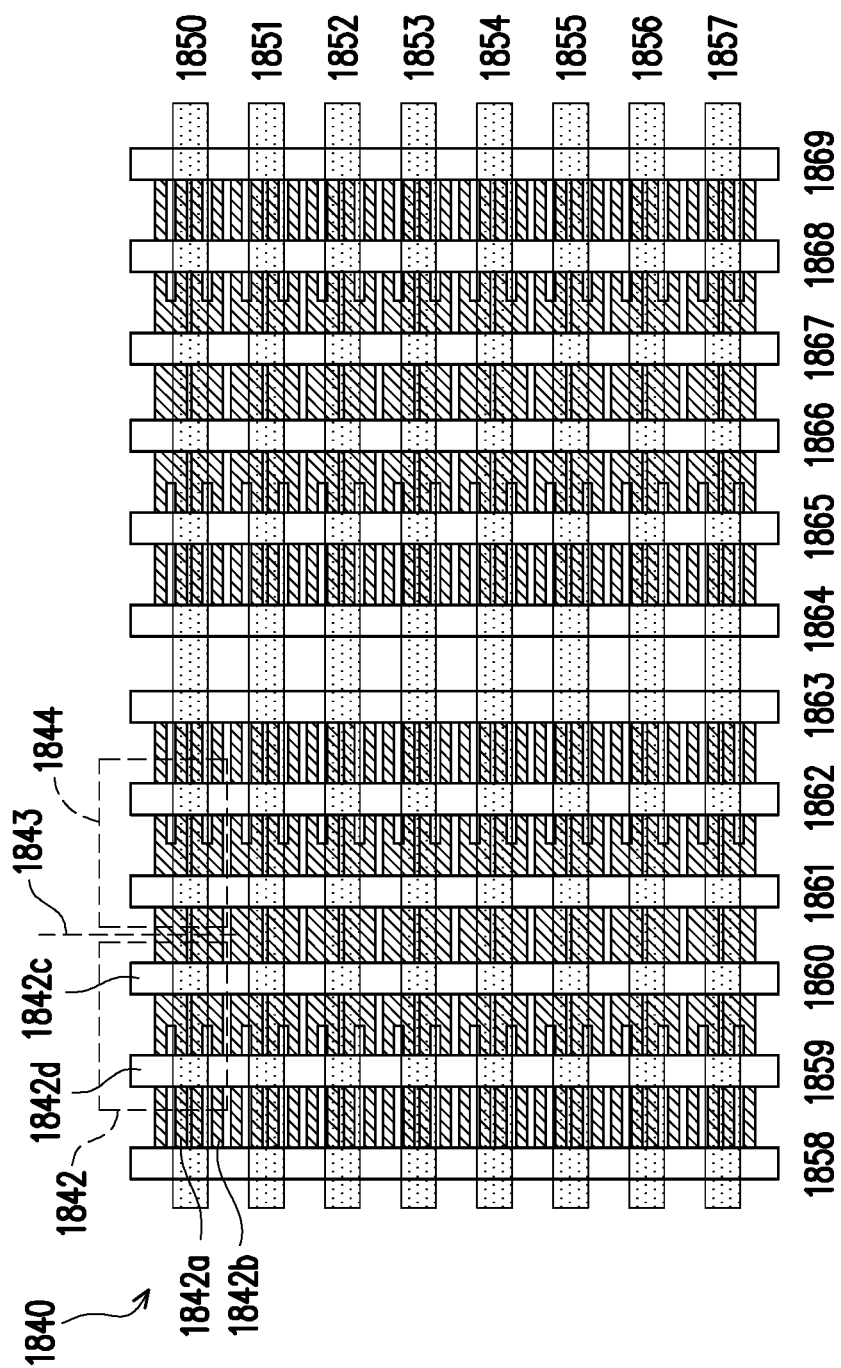
FIG. 18B illustrates an example design layout of the memory array of FIG. 18A, in accordance with some embodiments.

FIG. 18B illustrates an example layout 1840 to make the memory array 1800, in accordance with some embodiments. The layout 1840 may include a number of bit/unit cell layouts (e.g., 1842, 1844) arranged with respect to one another. In some embodiments, each of the bit cell layouts 1842-1844 may be substantially similar to the layout 220 shown in FIG. 2B. For example, the bit cell layout 1842 includes active features 1842a (similar to the active feature 221) and 1842b (similar to the active feature 222), and gate features 1842c (similar to the gate feature 223) and 1842d (similar to the gate feature 224). By connecting the number of bit unit cell layouts via respective gate features (e.g., 1858, 1859, 1860, 1861, 1862, 1863, 1864, 1865, 1866, 1867, 1868, 1869) and BL features (e.g., 1850, 1851, 1852, 1853, 1854, 1855, 1856, 1857), the memory array 1800 may be realized. The gate feature 1842d may be a portion of the gate feature 1859 and the gate feature 1842c may be a portion of the gate feature 1860. It is appreciated that the bit cell layouts (e.g., 1842-1844) may be replaced by any of the other layouts shown in FIGS. 2A-G, while remaining within the scope of the present disclosure. In some embodiments, two adjacent ones of the bit cell layouts, disposed along the same BL, may be mirrored from each other (e.g., rotated by 180° with respect to a central line between the two adjacent bit cell layouts). For example, the bit cell layouts 1842 and 1844 may be mirrored from each other with respect to a symbolic central line 1843.

Figure 18C:
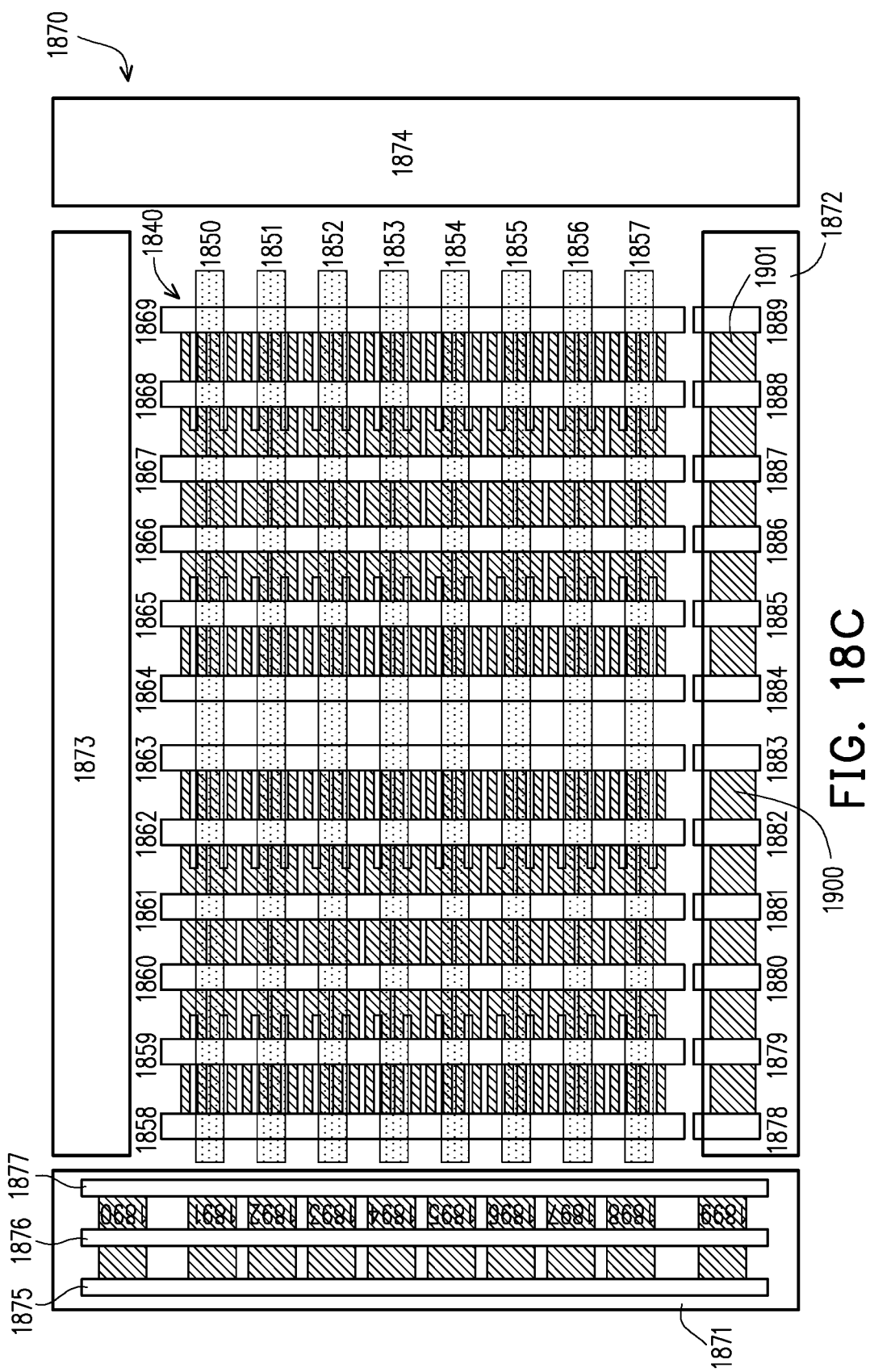
FIG. 18C illustrates another example design layout of the memory array of FIG. 18A, in accordance with some embodiments.

FIG. 18C illustrates another example layout 1870 to make the memory array 1800, in accordance with some embodiments. The layout 1870 may be substantially similar to the layout 1840 of FIG. 18B except that the layout 1870 includes one or more edge dummy protections. Thus, the reference numerals of FIG. 18B may be continuously used in the discussion of FIG. 18C. As shown, the layout 1870 includes edge dummy protections 1871, 1872, 1873, and 1874 disposed along the sides of the layout 1840. The edge dummy protections 1871 and 1874 may include one or more gate features (e.g., 1875, 1876, 1877) in parallel with the gate features 1858-1869 of the layout 1840, and one or more active features (e.g., 1891, 1892, 1893, 1894, 1895, 1896, 1897, 1898) aligned with the BLs 1850-1857. Further, the edge dummy protection 1870 may further include two side active features 1890 and 1899. For brevity, the features of the edge dummy protection 1874 are omitted. Similarly, the edge dummy protections 1872 and 1873 may include one or more gate features (e.g., 1878, 1879, 1880, 1881, 1882, 1883, 1884, 1885, 1886, 1887, 1888, 1889) respectively aligned with the gate features 1858-1869, and one or more active features (e.g., 1900, 1901) aligned with the side active feature 1899. For brevity, the features of the edge dummy protection 1873 are omitted. In some embodiments, device features (e.g., gates) to be formed by the edge dummy protections 1870-1874 may be characterized with no active functions.

In one aspect of the present disclosure, a memory device is disclosed. The memory device includes a first transistor. The first transistor includes one or more first semiconductor nanostructures spaced apart from one another along a first direction. Each of the one or more first semiconductor nanostructures has a first width along a second direction perpendicular to the first direction. The memory device includes a second transistor coupled to the first transistor in series. The second transistor includes one or more second semiconductor nanostructures spaced apart from one another along the first direction. Each of the one or more second semiconductor nanostructures has a second, different width along the second direction.

In another aspect of the present disclosure, a memory device layout is disclosed. The memory device layout includes a first feature including a first sub-feature and a second sub-feature. The first sub-feature is configured to define a source and a drain of a first transistor and the second sub-feature is configured to define a source and a drain of a second transistor. The first sub-feature, extending along a first direction, has a first width along a second direction perpendicular to the first direction. The second sub-feature, extending from the first sub-feature along the first direction, has a second, different width along the second direction. The memory device layout includes a second feature configured to define a gate of the first transistor. The second feature extends over the first sub-feature along the second direction. The memory device layout includes third feature configured to define a gate of the second transistor. The third feature extends over the second sub-feature along the second direction.

In yet another aspect of the present disclosure, a method for fabricating a semiconductor device is disclosed. The method includes forming a plurality of first nanostructures spaced apart from one another along a first direction. Each of the plurality of first nanostructures has a first width along a second direction perpendicular to the first direction. The method includes forming a plurality of second nanostructures spaced apart from one another along the first direction. Each of the plurality of second nanostructures has a second, different width along the second direction. The method includes forming a first gate, extending along the second direction, that wraps around each of the plurality of first nanostructures with a first gate dielectric disposed therein. The method includes forming a second gate, extending along the second direction, that wraps around each of the plurality of second nanostructures with a second gate dielectric disposed therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first transistor comprising:
one or more first semiconductor nanostructures spaced apart from one another along a first direction, each of the one or more first semiconductor nanostructures having a first width along a second direction perpendicular to the first direction; and
a second transistor, coupled to the first transistor in series, comprising:
one or more second semiconductor nanostructures spaced apart from one another along the first direction, each of the one or more second semiconductor nanostructures having a second, different width along the second direction.

2. The memory device of claim 1, wherein the first transistor and the second transistor are configured as a programming transistor and a reading transistor of an antifuse memory cell, respectively, the one or more first semiconductor nanostructures of the programming transistor configured to conduct currents along a third direction perpendicular to the first direction and the second direction, the one or more second semiconductor nanostructures of the reading transistor configured to conduct the currents along the third direction.

3. The memory device of claim 1, wherein the second, different width is greater than the first width.

4. The memory device of claim 1, wherein a ratio of the second, different width to the first width satisfies a condition.

5. The memory device of claim 1, further comprising:
one or more third semiconductor nanostructures spaced apart from one another along the first direction, each of the one or more third semiconductor nanostructures having the first width along the second direction.

6. The memory device of claim 5, wherein each of the one or more third semiconductor nanostructures is in parallel with a corresponding one of the one or more first conduction channels and a corresponding one of the one or more second semiconductor nanostructures.

7. The memory device of claim 1, further comprising:
a first gate metal wrapping around each of the one or more first semiconductor nanostructures with a first gate dielectric disposed therein; and
a second gate metal wrapping around each of the one or more second semiconductor nanostructures with a second gate dielectric disposed therein.

8. The memory device of claim 7, further comprising:
a first drain, disposed on a first side of the first gate metal, that is coupled to the one or more first semiconductor nanostructures, wherein the first drain has the first width along the second direction;
a first source, disposed on a second side of the first gate metal, that is coupled to the one or more first semiconductor nanostructures, wherein the first source has the first width along the second direction;
a second drain, disposed on the second side of the first gate metal and on a first side of the second gate metal, that is coupled to the one or more second semiconductor nanostructures, wherein the second drain has the second width along the second direction; and
a second source, disposed on a second side of the second gate metal, that is coupled to the one or more second semiconductor nanostructures, wherein the second source has the second width along the second direction.

9. The memory device of claim 1, further comprising:
a first gate metal wrapping around each of the one or more first semiconductor nanostructures with a first gate dielectric disposed therein;
a second gate metal wrapping around each of the one or more second semiconductor nanostructures with a second gate dielectric disposed therein;
a third gate metal wrapping around each of the one or more second semiconductor nanostructures with a third gate dielectric disposed therein;
a first drain, disposed on a first side of the first gate metal, that is coupled to the one or more first semiconductor nanostructures, wherein the first drain has the first width along the second direction;
a first source, disposed on a second side of the first gate metal, that is coupled to the one or more first semiconductor nanostructures, wherein the first source has the first width along the second direction;
a second drain, disposed on the second side of the first gate metal and on a first side of the second gate metal, that is coupled to the one or more second semiconductor nanostructures, wherein the second drain has the second width along the second direction;
a second source, disposed on a second side of the second gate metal, that is coupled to the one or more second semiconductor nanostructures, wherein the second source has the second width along the second direction;
a third drain, disposed on the second side of the second gate metal and on a first side of the third gate metal, that is coupled to the one or more second semiconductor nanostructures, wherein the third drain has the second width along the second direction;
a third source, disposed on a second side of the third gate metal, that is coupled to the one or more second semiconductor nanostructures, wherein the third source has the second width along the second direction.

10. A memory device layout, comprising:
a first feature including a first sub-feature and a second sub-feature, the first sub-feature configured to define a source and a drain of a first transistor and the second sub-feature configured to define a source and a drain of a second transistor, wherein the first sub-feature, extending along a first direction, has a first width along a second direction perpendicular to the first direction, and wherein the second sub-feature, extending from the first sub-feature along the first direction, has a second, different width along the second direction;
a second feature configured to define a gate of the first transistor, the second feature extending over the first sub-feature along the second direction; and
a third feature configured to define a gate of the second transistor, the third feature extending over the second sub-feature along the second direction;
wherein the first sub-feature abuts the second sub-feature.

11. The memory device layout of claim 10, wherein the second, different width is greater than the first width.

12. The memory device layout of claim 10, wherein a boundary between the first sub-feature and the second sub-feature of the first feature is located between the second feature and the third feature.

13. The memory device layout of claim 10, wherein the first feature is further configured to define respective source and drain of a third transistor, the memory device layout further comprising:
a fourth feature configured to define a gate of the third transistor, the fourth feature extending over the second sub-feature along the second direction.

14. The memory device layout of claim 10, wherein the first feature further includes a third sub-feature, in parallel with the first sub-feature, that has the first width along the second direction, the second sub-feature of the first feature also extending from the third sub-feature along the first direction.

15. The memory device layout of claim 10, wherein the first feature further includes a fourth sub-feature, in parallel with both the first sub-feature and the second sub-feature, that has the first width along the second direction.

16. The memory device layout of claim 10, wherein the gate of the first transistor is to be coupled to a programming word line, and the second transistor is to be coupled to a reading word line.

17. The memory device layout of claim 10, wherein the second sub-feature of the first feature includes a first portion and a second portion placed on different sides of the third feature, respectively, and wherein either the first portion or the second portion is to be coupled to a bit line.

18. The memory device layout of claim 10, wherein a ratio of the second, different width to the first width satisfies a condition.

19. A method for fabricating a semiconductor device, comprising:
- forming a plurality of first nanostructures spaced apart from one another along a first direction, each of the plurality of first nanostructures having a first width along a second direction perpendicular to the first direction;
- forming a plurality of second nanostructures spaced apart from one another along the first direction, each of the plurality of second nanostructures having a second, different width along the second direction;
- forming a first gate, extending along the second direction, that wraps around each of the plurality of first nanostructures with a first gate dielectric disposed therein; and
- forming a second gate, extending along the second direction, that wraps around each of the plurality of second nanostructures with a second gate dielectric disposed therein.

20. The method of claim 19, wherein the plurality of first nanostructures are configured as a conduction channel of a programming transistor of an anti-fuse cell and the plurality of second nanostructures are configured as a conduction channel of a reading transistor of the anti-fuse cell, the second, different width being greater than the first width.

* * * * *